(12) United States Patent
Sung et al.

(10) Patent No.: US 10,766,440 B2
(45) Date of Patent: Sep. 8, 2020

(54) ELECTRONIC DEVICE INCLUDING ANTENNA USING CONDUCTIVE MEMBER INCLUDED IN HOUSING

(71) Applicant: Samsung Electronics Co., Ltd., Gyeonggi-do (KR)

(72) Inventors: Sang Bong Sung, Gyeonggi-do (KR); Se Woong Kim, Gyeongsangnam-do (KR); Su Min Yun, Incheon (KR); In Young Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/982,361

(22) Filed: May 17, 2018

(65) Prior Publication Data

US 2018/0334112 A1    Nov. 22, 2018

(30) Foreign Application Priority Data

May 17, 2017 (KR) .................. 10-2017-0060920

(51) Int. Cl.
| | | |
|---|---|---|
| *B60R 16/023* | (2006.01) | |
| *B60R 25/24* | (2013.01) | |
| *H01Q 3/24* | (2006.01) | |
| *E05B 81/88* | (2014.01) | |
| *E05B 49/00* | (2006.01) | |
| *H05K 5/02* | (2006.01) | |
| *E05B 19/00* | (2006.01) | |
| *E05B 19/04* | (2006.01) | |

(52) U.S. Cl.
CPC ........ *B60R 16/023* (2013.01); *E05B 19/0082* (2013.01); *E05B 19/046* (2013.01); *E05B 49/00* (2013.01); *E05B 81/88* (2013.01); *H01Q 3/247* (2013.01); *H05K 5/0247* (2013.01); *B60R 25/24* (2013.01)

(58) Field of Classification Search
CPC combination set(s) only.
See application file for complete search history.

(56) References Cited

U.S. PATENT DOCUMENTS

| | | | |
|---|---|---|---|
| 4,524,594 A * | 6/1985 | Bascou | A45C 11/321 70/456 R |
| 8,270,914 B2 | 9/2012 | Pascolini et al. | |
| 9,172,139 B2 | 10/2015 | Pascolini et al. | |
| 2002/0021898 A1* | 2/2002 | Teramoto | G03B 17/24 396/310 |
| 2005/0068074 A1* | 3/2005 | Yahagi | H03L 7/0898 327/157 |
| 2011/0133995 A1 | 6/2011 | Pascolini et al. | |

(Continued)

FOREIGN PATENT DOCUMENTS

KR    20-1999-0006748    7/1997

*Primary Examiner* — Nabil H Syed
*Assistant Examiner* — Cal J Eustaquio
(74) *Attorney, Agent, or Firm* — The Farrell Law Firm, P.C.

(57) ABSTRACT

An electronic device is provided and includes a housing surrounding the electronic device, a wireless communication circuit positioned in the housing to communicate with a vehicle, and a switch connected to one of a first electrical path or a second electrical path, wherein the first electrical path includes a first antenna element extending along a first portion of the housing and the second electrical path includes a second antenna element extending along a second portion of the housing.

7 Claims, 13 Drawing Sheets

(56) References Cited

U.S. PATENT DOCUMENTS

| | | |
|---|---|---|
| 2011/0136447 A1 | 6/2011 | Pascolini et al. |
| 2013/0009828 A1 | 1/2013 | Pascolini et al. |
| 2013/0069768 A1* | 3/2013 | Madhyastha .......... G08C 19/12 340/12.5 |
| 2013/0178151 A1* | 7/2013 | Itzhaki .............. H04W 52/0245 455/26.1 |
| 2016/0187857 A1* | 6/2016 | Cho ....................... G04R 20/00 368/47 |

* cited by examiner

ELECTRONIC DEVICE INCLUDING ANTENNA USING CONDUCTIVE MEMBER INCLUDED IN HOUSING

CROSS-REFERENCE TO RELATED APPLICATION(S)

This application is based on and claims priority under 35 U.S.C. § 119 to Korean Patent Application Serial No. 10-2017-0060920, filed on May 17, 2017, in the Korean Intellectual Property Office, the disclosure of which is incorporated herein by reference.

BACKGROUND

1. Field

The present disclosure relates generally to antenna technology, and more particularly, to an electronic device for transmitting or receiving signals in multiple frequency bands using a wireless communication circuit included in a housing.

2. Description of Related Art

Recently, a vehicle key has evolved into a smart device capable of providing various functions. For example, a contemporary vehicle key may perform locking or unlocking of a door, control of vehicle start-up and cooling/heating equipment, and may output various information about a vehicle using a display included in the vehicle key. These functions may be performed by a mobile device (e.g., a smartphone or a tablet personal computer (PC)) or a wearable device (e.g., a smart watch) interworking with the vehicle.

To perform the above-described functions, bidirectional communication may be performed between a vehicle and an electronic device such as a vehicle key, a mobile device, or a wearable device. Accordingly, the above-described electronic device may include an antenna used for communicating with a vehicle.

Communication with a vehicle may be performed, for example, at a frequency of at least 434 MHz or 868 MHz. The length of an antenna for communication with a vehicle may be longer than that of an antenna for conventional network communication (e.g., cellular communication). For example, an antenna length of 18.75 cm may be required to implement a $\lambda/4$ antenna in the 400 MHz band. In addition, since many functions are performed in a vehicle, a multi-band antenna may be required for a device to communicate with the vehicle.

However, such electronic devices (e.g., vehicle keys) may have limited space. Further, when a metal component exists in a limited space of the electronic device, the performance of a radiator may deteriorate due to a scattering effect by metal, a trapping effect of an electromagnetic field, or a mismatch.

SUMMARY

The present disclosure is provided to address at least the above-mentioned problems and/or disadvantages and to provide at least the advantages described below.

Accordingly, an aspect of the present disclosure provides an electronic device that may be used as antennas in various frequency bands by using a segmented portion of a conductive housing included in the electronic device.

In accordance with an aspect of the present disclosure, an electronic device includes a housing surrounding the electronic device, a wireless communication circuit positioned in the housing to communicate with a vehicle, a first antenna element extending along a first portion of the housing, a second antenna element physically spaced apart from the first antenna element and extending along a second portion of the housing, a first radiator extending from the first antenna element, and a switch selectively connected to one of a first electrical path or a second electrical path, wherein the first electrical path includes the first antenna element and the first radiator, and the second electrical path includes the second antenna element. The wireless communication circuit may be set to communicate with the vehicle through an electrical path selected by the switch.

In accordance with another aspect of the present disclosure, an electronic device includes a housing including a first surface, a second surface facing away from the first surface, and a side surface surrounding a space between the first surface and the second surface, a wireless communication circuit positioned in the housing to communicate with a key system of a vehicle, a first conductive member extending along a first portion of the side surface, a second conductive member extending along a second portion of the side surface, and a conductive pattern positioned in the housing. The wireless communication circuit may communicate with the key system by using at least a portion of the conductive pattern, and only one of the first conductive member or the second conductive member.

According to the embodiments of the present disclosure, an electronic device having a limited space may efficiently transmit or receive signals in multiple bands.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
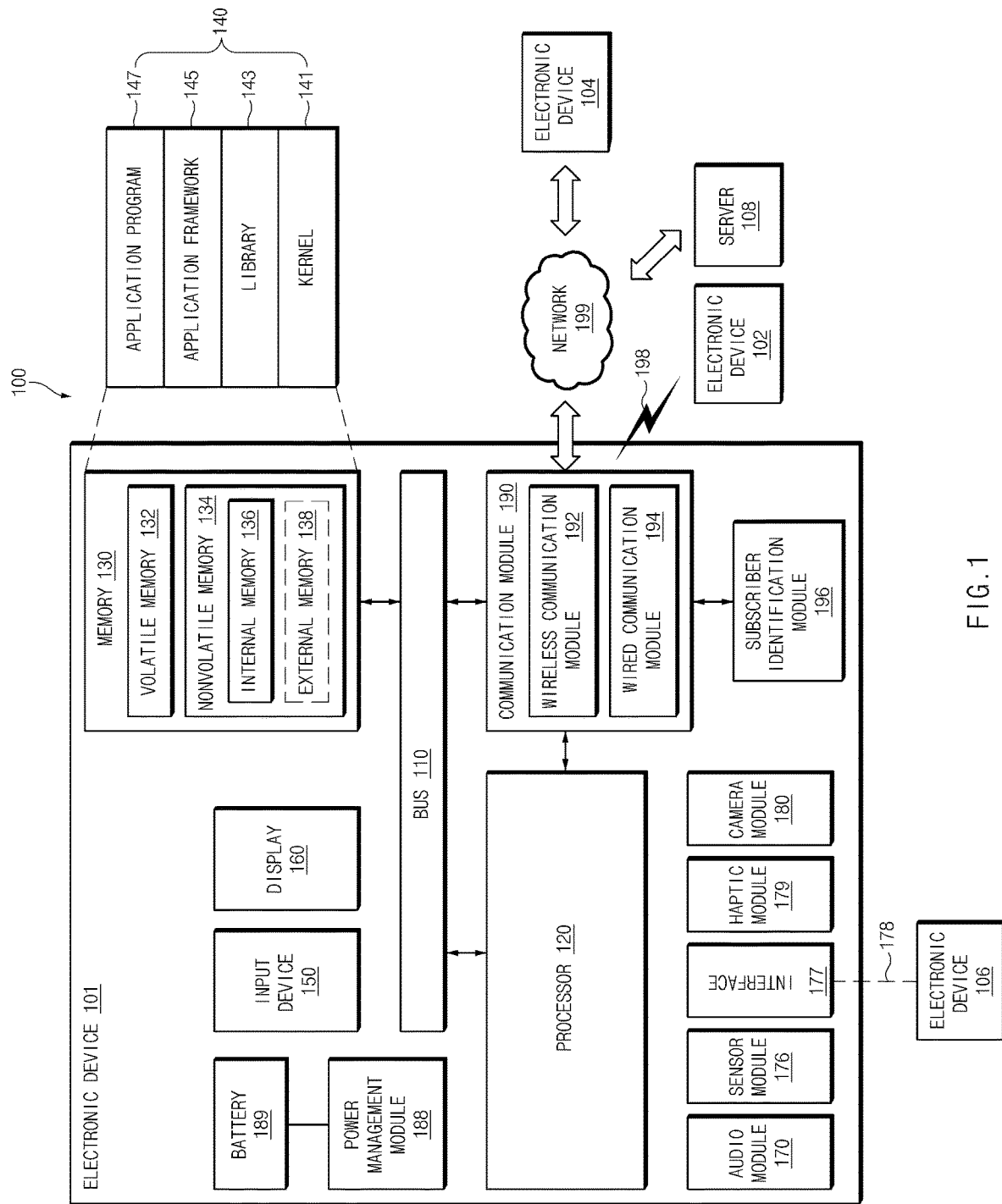
FIG. 1 is a block diagram illustrating an electronic device in a network environment, according to an embodiment.

Various embodiments of the present disclosure are described with reference to the accompanying drawings.

With regard to description of drawings, similar reference numerals may be used to refer to similar or related elements. It is to be understood that terms of a singular form may include plural forms unless otherwise specified. As used herein, the expressions "A or B", "at least one of A and B", "at least one of A or B", "A, B, or C", "at least one of A, B, and C", or "at least one of A, B or C" may include any and all combinations of one or more of the associated listed items. Terms such as "first," or "second" may be used to simply distinguish a corresponding component from another, and does not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the expressions "adapted to" or "configured to" may be interchangeably used with the expressions "suitable for", "having the capacity to", "changed to", "made to", "capable of" or "designed to" in hardware or software. Further, the expression "a device configured to" may mean that the device is "capable of" operating together with another device or another component. For example, a "processor configured to perform A, B, and C" may mean a dedicated processor (e.g., an embedded processor) for performing corresponding operations or a generic-purpose processor (e.g., a central processing unit (CPU) or an application processor (AP)) which performs corresponding operations by executing one or more software programs stored in a memory device.

As used herein, the term "module" may include a unit implemented in hardware, software, or firmware, and may interchangeably be used with other terms, such as, "logic", "logical block", "component", "circuit". A module may be a minimum unit of an integrated component or a part thereof, or may be a minimum unit for performing one or more functions. A module may be implemented mechanically or electronically and may include, for example, an application specific integrated circuit (ASIC) chip, a field programmable gate array (FPGA), and a programmable logic device for performing some operations, which are known or will be developed.

An electronic device may include various forms of devices. For example, the electronic device may include at least one of, for example, portable communication devices (e.g., smartphones), computer devices (e.g., personal digital assistants (PDAs), tablet PCs, laptop PCs, desktop PCs, workstations, or servers), portable multimedia devices (e.g., electronic book readers or motion picture experts group (MPEG-1 or MPEG-2) audio layer 3 (MP3) players), portable medical devices (e.g., heartbeat measuring devices, blood glucose monitoring devices, blood pressure measuring devices, and body temperature measuring devices), cameras, or wearable devices. Wearable device may include at least one of accessory type devices (e.g., watches, rings, bracelets, anklets, necklaces, glasses, contact lens, or head-mounted-devices (HMDs)), fabric or garment-integrated type devices (e.g., electronic apparel), body-attached type devices (e.g., a skin pads or tattoos), or bio-implantable type devices (e.g., implantable circuits).

The electronic device may include at least one of, for example, televisions (TVs), digital versatile disk (DVD) players, audio devices, audio accessory devices (e.g., speakers, headphones, or headsets), refrigerators, air conditioners, cleaners, ovens, microwave ovens, washing machines, air cleaners, set-top boxes, home automation control panels, security control panels, game consoles, electronic dictionaries, electronic keys, camcorders, or electronic picture frames.

The electronic device may include at least one of navigation devices, satellite navigation systems (e.g., global navigation satellite systems (GNSSs)), event data recorders (EDRs) (e.g., black boxes for a car, a ship, or a plane), vehicle infotainment devices (e.g., head-up displays for vehicle), industrial or home robots, drones, automated teller machines (ATMs), points of sales (POSs) devices, measuring instruments (e.g., water meters, electricity meters, or gas meters), or Internet of things (IoT) devices (e.g., light bulbs, sprinkler devices, fire alarms, thermostats, or street lamps).

The electronic device may provide functions of a plurality of devices, such as smartphones which have a measurement function of personal biometric information (e.g., heart rate or blood glucose). Further, the term "user" may refer to a person who uses an electronic device or may refer to a device (e.g., an artificial intelligence electronic device) that uses the electronic device.

FIG. 1 illustrates a block diagram of an electronic device 101 in a network environment 100, according to an embodiment.

Referring to FIG. 1, the electronic device 101 in the network environment 100 may communicate with an electronic device 102 via a first network 198 (e.g., a short-range wireless communication network), or may communicate with an electronic device 104 or a server 108 via a second network 199 (e.g., a long-range wireless communication network). According to an embodiment, the electronic device 101 may communicate with the electronic device 104 via the server 108.

According to an embodiment, the electronic device 101 may include a bus 110, a processor 120, a memory 130, an input device 150 (e.g., a microphone or a mouse), a display device 160, an audio module 170, a sensor module 176, an interface 177, a haptic module 179, a camera module 180, a power management module 188, a battery 189, a communication module 190, and a subscriber identification module (SIM) 196. The electronic device 101 may not include at least one (e.g., the display device 160 or the camera module 180) of the above-described elements or may further include other element(s). The bus 110 may interconnect the above-described elements 120 to 190 and may include a circuit for conveying signals (e.g., a control messages or data) between the above-described elements.

The processor 120 may include one or more of a CPU, an AP, a graphics processing unit (GPU), an image signal processor (ISP) of a camera or a communication processor (CP). According to an embodiment, the processor 120 may be implemented with a system on chip (SoC) or a system in package (SiP). For example, the processor 120 may drive an operating system (OS) or an application program to control at least one other element (e.g., hardware or software element) of the electronic device 101 connected to the processor 120 and may process and compute various data. The processor 120 may load a command or data, which is received from at least one other element (e.g., the communication module 190), into a volatile memory 132 to process the command or data and may store the resulting data into a nonvolatile memory 134.

The memory 130 may include the volatile memory 132 or the nonvolatile memory 134. The volatile memory 132 may include a random access memory (RAM) (e.g., a dynamic RAM (DRAM), a static RAM (SRAM), or a synchronous DRAM (SDRAM)). The nonvolatile memory 134 may include a programmable read-only memory (PROM), a one time PROM (OTPROM), an erasable PROM (EPROM), an electrically EPROM (EEPROM), a mask ROM, a flash ROM, a flash memory, a hard disk drive (HDD), or a solid-state drive (SSD). In addition, the nonvolatile memory 134 may be configured in the form of an internal memory 136 or an external memory 138 which is available through connection only if necessary, according to the connection with the electronic device 101. The external memory 138 may further include a flash drive such as compact flash (CF), secure digital (SD), micro-SD (Micro-SD), mini-SD (Mini-SD), extreme digital (xD), a multimedia card (MMC), or a memory stick. The external memory 138 may be operatively or physically connected with the electronic device 101 in a wired manner (e.g., a cable or a universal serial bus (USB)) or a wireless (e.g., Bluetooth) manner.

The memory 130 may store at least one software element, such as a command or data associated with the program 140, of the electronic device 101. The program 140 may include a kernel 141, a library 143, an application framework 145 or an application program (an application) 147.

The input device 150 may include a microphone, a mouse, or a keyboard.

According to an embodiment, the keyboard may include a keyboard physically connected to the electronic device 101 or a virtual keyboard displayed through the display device 160.

The display device 160 may include a display, a hologram device or a projector, in addition to a control circuit to control a relevant device. The display device 160 may include a liquid crystal display (LCD), a light emitting diode (LED) display, an organic LED (OLED) display, a microelectromechanical systems (MEMS) display, or an electronic paper display. According to an embodiment, the display device 160 may be flexibly, transparently, or wearably implemented. The display device 160 may include touch circuitry, which is able to detect a user's input, such as a gesture input, a proximity input, or a hovering input. Further, the display device 160 may include a pressure sensor (a "force sensor") which is able to measure an intensity of pressure from a touch. The touch circuit or the pressure sensor may be implemented integrally with the display or may be implemented with at least one sensor separately from the display. The hologram device may show a stereoscopic image in a space using interference of light. The projector may project light onto a screen to display an image. The screen may be located inside or outside the electronic device 101.

The audio module 170 may convert a sound into an electrical signal or vice versa. According to an embodiment, the audio module 170 may obtain a sound through the input device 150 (e.g., a microphone) or may output the sound through an output device (e.g., a speaker or a receiver) included in the electronic device 101, the electronic device 102 (e.g., a wireless speaker or a wireless headphone)) or the electronic device 106 (e.g., a wired speaker or a wired headphone) connected with the electronic device 101.

The sensor module 176 may measure or detect an internal operating state (e.g., power or temperature) of the electronic device 101 or an external environment state (e.g., altitude, humidity, or brightness) to generate an electrical signal or a data value corresponding to the information of the measured or detected state. The sensor module 176 may include at least one of a gesture sensor, a gyro sensor, a barometric pressure sensor, a magnetic sensor, an acceleration sensor, a grip sensor, a proximity sensor, a color sensor (e.g., a red, green, blue (RGB) sensor), an infrared sensor, a biometric sensor (e.g., an iris sensor, a fingerprint senor, a heartbeat rate monitoring (HRM) sensor, an e-nose sensor, an electromyography (EMG) sensor, an electroencephalogram (EEG) sensor, or an electrocardiogram (ECG) sensor), a temperature sensor, a humidity sensor, an illuminance sensor, or an ultra violet (UV) sensor. The sensor module 176 may further include a control circuit for controlling at least one or more sensors included therein. The electronic device 101 may control the sensor module 176 by using the processor 120 or a sensor hub separate from the processor 120 while the processor 120 is in a sleep state. The sensor hub may operate without awakening the processor 120 to control at least a portion of the operation or the state of the sensor module 176.

According to an embodiment, the interface 177 may include a high definition multimedia interface (HDMI), a USB, an optical interface, a recommended standard 232 (RS-232), a D-subminiature (D-sub), a mobile high-definition link (MHL) interface, an SD card/multi-media card (MMC) interface, or an audio interface. A connector 178 may physically connect the electronic device 101 and the electronic device 106. The connector 178 may include a USB connector, an SD card/MMC connector, or an audio connector (e.g., a headphone connector).

The haptic module 179 may convert an electrical signal into mechanical stimulation (e.g., vibration or motion) or electrical stimulation. For example, the haptic module 179 may apply tactile or kinesthetic stimulation to a user. The haptic module 179 may include a motor, a piezoelectric element, or an electric stimulator.

The camera module 180 may capture a still image and a moving picture.

According to an embodiment, the camera module 180 may include at least one lens (e.g., a wide-angle lens and a telephoto lens, or a front lens and a rear lens), an image sensor, an image signal processor, or a flash (e.g., a light emitting diode or a xenon lamp).

The power management module 188, which is to manage the power of the electronic device 101, may constitute at least a portion of a power management integrated circuit (PMIC).

The battery 189 may include a primary cell, a secondary cell, or a fuel cell and may be recharged by an external power source to supply power at least one element of the electronic device 101.

The communication module 190 may establish a communication channel between the electronic device 101 and the first external electronic device 102, the second external electronic device 104, or the server 108. The communication module 190 may support wired communication or wireless communication through the established communication channel. According to an embodiment, the communication module 190 may include a wireless communication module 192 or a wired communication module 194. The communication module 190 may communicate with the external device through a first network 198 (e.g. a wireless local area network such as Bluetooth or Infrared Data Association (IrDA)) or a second network 199 (e.g., a wireless wide area network such as a cellular network) through a relevant module among the wireless communication module 192 or the wired communication module 194.

The wireless communication module 192 may support cellular communication, local wireless communication, GNSS communication. The cellular communication may include long-term evolution (LTE), LTE Advance (LTE-A), code division multiple access (CDMA), wideband CDMA (WCDMA), universal mobile telecommunications system (UMTS), wireless broadband (WiBro), or global system for mobile communications (GSM). The local wireless communication may include wireless fidelity (Wi-Fi), Wi-Fi direct, light fidelity (Li-Fi), Bluetooth, Bluetooth low energy (BLE), Zigbee, near field communication (NFC), magnetic secure transmission (MST), radio frequency (RF), or a body area network (BAN). The GNSS may include at least one of a global positioning system (GPS), a global navigation satellite system (Glonass), beidou navigation satellite system (Beidou), or the European global satellite-based navigation system (Galileo). In the present disclosure, "GPS" and "GNSS" may be interchangeably used.

According to an embodiment, when the wireless communication module 192 supports cellar communication, the wireless communication module 192 may identify or authenticate the electronic device 101 within a communication network using the SIM 196 card. According to an embodiment, the wireless communication module 192 may include a CP separate from the processor 120 (e.g., an AP). In this case, the communication processor may perform at least a portion of the functions associated with at least one of elements 110 to 196 of the electronic device 101 instead of the processor 120 when the processor 120 is in an inactive (sleep) state, and together with the processor 120 when the processor 120 is in an active state. According to an embodiment, the wireless communication module 192 may include a plurality of communication modules, each supporting only a relevant communication scheme among cellular communication, local wireless communication, or a GNSS communication.

The wired communication module 194 may include, for example, a local area network (LAN) service, a power line communication, or a plain old telephone service (POTS).

The first network 198 may employ Wi-Fi direct or Bluetooth for transmitting or receiving commands or data through wireless direct connection between the electronic device 101 and the first external electronic device 102. The second network 199 may include a telecommunication network (e.g., a computer network such as an LAN or a WAN, the Internet or a telephone network) for transmitting or receiving commands or data between the electronic device 101 and the second electronic device 104.

The commands or the data may be transmitted or received between the electronic device 101 and the second external electronic device 104 through the server 108 connected with the second network 199. Each of the first external electronic device 102 and the second external electronic device 104 may be a device which is of a different type from or the same as that of the electronic device 101.

According to an embodiment, all or part of the operations that the electronic device 101 will perform may be executed by another electronic device or a plurality of electronic devices (e.g., the electronic devices 102 and 104 or the server 108).

According to an embodiment, when the electronic device 101 executes any function or service automatically or in response to a request, the electronic device 101 may not perform the function or the service internally, but may alternatively or additionally transmit requests for at least a part of a function associated with the electronic device 101 to any other device (e.g., the electronic devices 102 or 104 or the server 108). The other electronic device may execute the requested or additional function and may transmit the execution result to the electronic device 101. The electronic device 101 may provide the requested function or service using the received result or may additionally process the received result to provide the requested function or service. To this end cloud computing, distributed computing, or client-server computing may be used.

Figure 2:
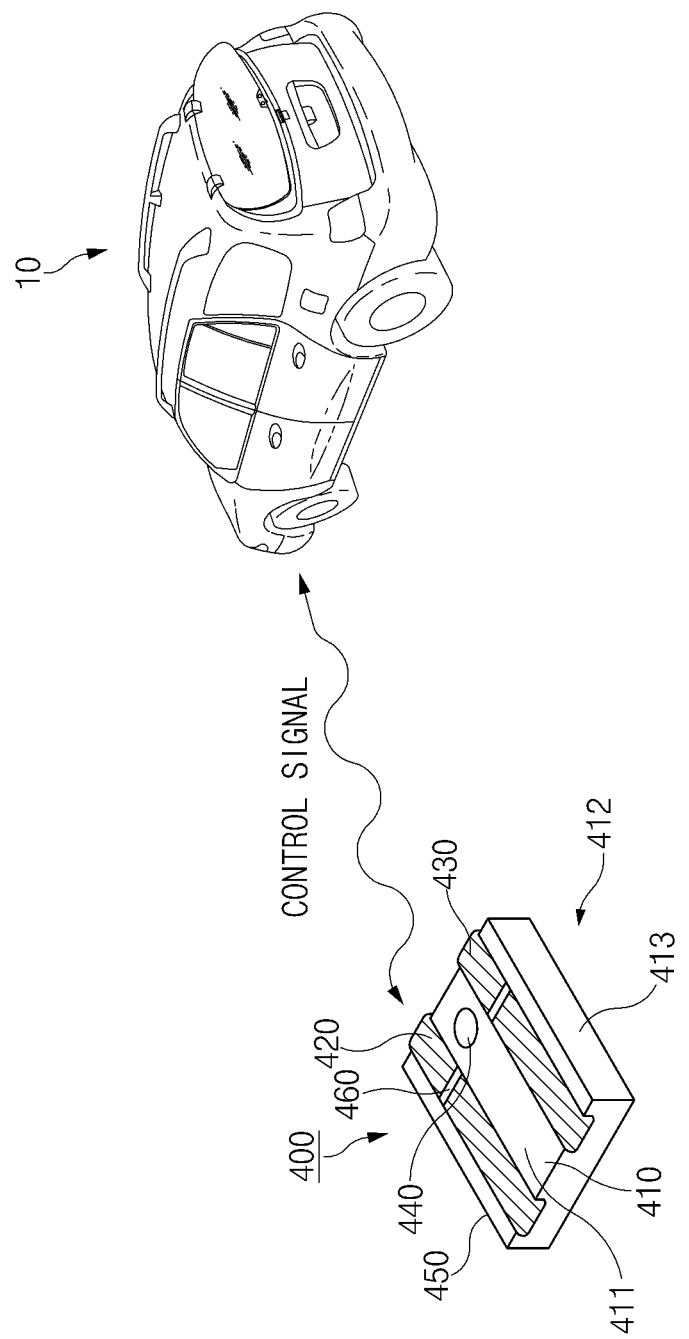
FIG. 2 is a view illustrating an environment in which an electronic apparatus is operated, according to an embodiment.

FIG. 2 is a view illustrating an environment in which an electronic apparatus is operated, according to an embodiment.

Referring to FIG. 2, an electronic device (e.g., the electronic device 101 of FIG. 1) 400 may control an external device 10. For example, the electronic device 400 may be a vehicle key or a vehicle key system as illustrated in FIG. 2, a mobile device such as a smartphone, a tablet PC, or a wearable device such as a smart watch. The external device 10 may be a vehicle or a device, such as home electronic appliances, controllable by the electronic device 400.

The electronic device 400 may include a housing 410, a first conductive member 420 and a second conductive member 430, and a control button 440. A region 450 of the housing 410 may include a nonconductive member. According to an embodiment, when an input is generated from the control button 440 by a user, the electronic device 400 may transmit a control signal to the external device 10 by using at least one conductive member (e.g., the first conductive member 420) exposed outside of the housing 410. The electronic device 400 may wirelessly transmit the control signal to the external device 10 by using the first conductive member 420 and/or the second conductive member 430. For example, the electronic device 400 may transmit a signal to the external device 10 to control a door locking state, a vehicle start-up, an operation of heating and cooling equipment, an opening/closing of a sunroof, and/or an opening/closing of a window.

According to an embodiment, the housing 410 may include a first surface 411 (e.g., a front surface), a second surface 412 (e.g., a rear surface) facing away from the first surface 411, and a side surface 413 surrounding a space between the first surface 411 and the second surface 412.

According to an embodiment, the first conductive member 420 and/or the second conductive member 430 may be segmented into a plurality of antenna elements by a long thin slit. The nonconductive member 460 may be filled with the long thin slit.

According to an embodiment, parts of the first conductive member 420 may be segmented and have electrical lengths for transmitting signals in different frequency bands. Parts of the second conductive member 430 may be segmented and have electrical lengths for transmitting signals in different frequency bands. According to an embodiment, the electronic device 400 may receive a signal from the external device 10 by using at least a portion of the segmented first conductive member 420 and/or at least a portion of the segmented second conductive member 430. For example, the electronic device 400 may receive, from the external device 10, a signal including information about a connection state of the electronic device 400 and the external device 10, a remaining fuel amount, a travel distance, an operation of heating and cooling equipment, or an opening/closing of a window.

According to an embodiment, the electronic device 400 may transmit/receive a signal to/from a vehicle or a vehicle key system. A frequency of the control signal transmitted/ received between the electronic device 400 and the external device 10 may be about 434 MHz or about 868 MHz. According to an embodiment, to enable an antenna to operate at about 434 MHz or about 868 MHz, at least a portion of a conductive housing arranged in the housing 410 of the electronic device 400 may be used as an antenna element. To implement the electronic device 400 for various frequency bands, the segment may be included in a portion of the conductive housing.

Figure 3:
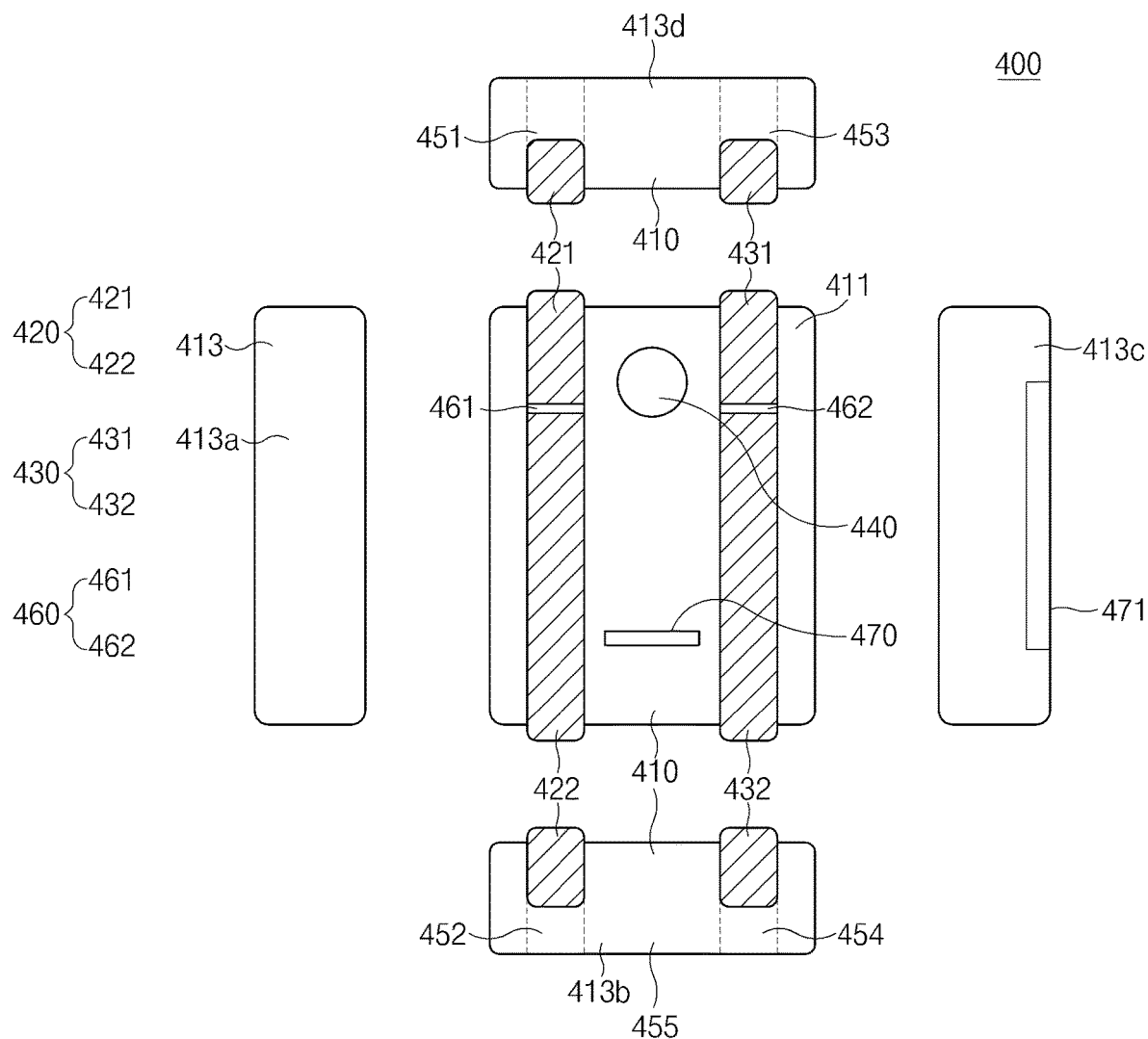
FIG. 3 is a view illustrating an external configuration of an electronic device, according to an embodiment.

FIG. 3 is a view illustrating an external configuration of an electronic device, according to an embodiment.

Referring to FIG. 3, the electronic device may include the housing 410, the first conductive member 420, the second conductive member 430, and the control button 440. For example, the electronic device 400 may be a vehicle key for wirelessly controlling a vehicle.

According to an embodiment, the housing 410 may surround an element (e.g., a processor, a memory, or a communication circuit). According to an embodiment, the housing 410 may include the first surface 411, the second surface facing away from the first surface 411, and the side surface 413 surrounding the space between the first surface 411 and the second surface. According to an embodiment, the control button 440 may be arranged on the first surface 411. The side surface 413 may include first to fourth sides 413a to 413d. The first and third sides 413a and 413c may have lengths longer than the second and fourth sides 413b and 413d.

According to various embodiments, the first conductive member 420 may be exposed outside the housing 410. For example, the first conductive member 420 may be a metal frame exposed outside the housing 410. According to an embodiment, the first conductive member 420 may be arranged on the first surface 411 of the housing 410. For example, the first conductive member 420 may extend along a portion of the first surface 411 of the housing 410. The first conductive member 420 may be arranged to extend along a portion of the side surface 413 of the housing 410. The first conductive member 420 may be arranged to extend from the first surface 411 of the housing 410 toward the second surface via the side surface 413. For example, the first conductive member 420 may have a "C" shape to surround the first surface 411, one side surface 413 and the second surface. The first conductive member 420 may extend towards the second surface beyond a region 451 of the fourth side 413d (e.g., an upper portion) of the electronic device 400. The first conductive member 420 may extend to the second surface beyond a region 452 of the second side 413b (e.g., a lower portion).

According to an embodiment, the first conductive member 420 may be segmented by at least one nonconductive member 461. The segmented first conductive member 420 may include a first antenna element 421 and a second antenna element 422. The first antenna element 421 and the second antenna element 422 may be physically spaced apart from each other by the nonconductive member 461.

According to an embodiment, the first antenna element 421 may be configured to transmit/receive a signal having a first frequency band. The first frequency band may be a frequency band through which a signal is transmitted/received to/from an external device (e.g., the external device 10 of FIG. 2). The first frequency band may be a frequency band through which a remote keyless entry (RKE) system or a service similar to the RKE system is provided. The first frequency band may be about 434 MHz. The second antenna element 422 may be configured to transmit/receive a signal having a second frequency band different from the first frequency band. A signal transmitted/received in the second frequency band may be a cellular (e.g., 3G or LTE) signal, a GPS signal, a Bluetooth low energy (BLE) signal, or a Wi-Fi signal.

According to an embodiment, the second conductive member 430 may be exposed outside the housing 410. For example, the second conductive member 430 may be a metal frame exposed outside the housing 410.

According to an embodiment, the housing 410 may include the first conductive member 420 and the second conductive member 430 spaced apart from each other by segmentation.

According to an embodiment, the second conductive member 430 may have the same or similar shape as the first conductive member 420. The second conductive member 430 may be arranged on the first surface 411 of the housing 410 in the same or a similar manner as the first conductive member 420. The second conductive member 430 may extend along a portion of the first surface 411 of the housing 410. The second conductive member 430 may extend to the second surface beyond a region of the fourth side 413d (e.g., an upper portion) of the electronic device 400. The second conductive member 430 may extend along a portion of the side surface 413. The second conductive member 430 may be segmented into third and fourth antenna elements 431 and 432 by a nonconductive member 462. The third and fourth antenna elements 431 and 432 may be physically spaced apart from each other by the nonconductive member 462. Although the second conductive member 430 which is segmented into the third and fourth antenna elements 431 and 432 is illustrated in FIG. 3, the embodiment is not limited thereto and the second conductive member 430 may include one antenna element which is not segmented.

According to an embodiment, the second conductive member 430 may be arranged to face the first conductive member 420 The second conductive member 430 may be arranged symmetrically with the first conductive member 420. For example, when the first conductive member 420 is arranged left of the electronic device 400 when viewed from above the first surface 411, the second conductive member 430 may be arranged right of the electronic device 400 such that the second conductive member 430 is symmetrical with the first conductive member 420.

According to various embodiments, the second conductive member 430 may have a different shape from that of the first conductive member 420. The third and fourth antenna elements 431 and 432 may have different shapes from those of the first antenna element 421 and the second antenna element 422. In another example, the second conductive member 430 may be arranged asymmetrically with the first conductive member 420.

According to an embodiment, the third antenna element 431 may be configured to transmit/receive a signal in a third frequency band. The third frequency band may be a frequency band for transmitting/receiving a signal to/from an external device (e.g., the external device 10 in FIG. 2). The third frequency band may be different from the first frequency band. For example, the third frequency band may include a frequency of about 868 MHz. Also, the fourth antenna element 432 may be configured to transmit/receive a signal in a fourth frequency band.

According to an embodiment, the housing 410 of the electronic device 400 may include a fifth antenna element 470 and/or a sixth antenna element 471 for transmitting/receiving a signal in an additional frequency band.

According to an embodiment, the fifth antenna element 470 may have an electrical length for transmitting/receiving a signal in a specific frequency band through a portion of the housing 410. For example, the fifth antenna element 470 may have an electrical length for transmitting/receiving a BLE signal. The fifth antenna element 470 may be a metal frame exposed outside the housing 410. The fifth antenna element 470 may be physically spaced apart from the first to fourth antenna elements 421 to 432. For example, as illustrated in FIG. 2, the fifth antenna element 470 may be arranged on a lower end of the first surface 411 of the electronic device 400.

According to an embodiment, the sixth antenna element 471, which extends along a portion of the housing 410 supporting an antenna of the electronic device 400, may be included in the housing 410. The sixth antenna element 471 may be arranged at a position such that the sixth antenna element 471 is physically spaced apart from the first to fourth antenna elements 421 to 432.

According to an embodiment, some antenna elements may be electrically coupled to each other. For example, the sixth antenna element 471 may be electrically coupled to the fourth antenna element 432. The sixth antenna element 471 may be arranged on the side surface 413 adjacent to the fourth antenna element 432 to enable the sixth antenna element 471 to be coupled with the fourth antenna element 432. Additionally, the fourth antenna element 432 may be arranged adjacent to an edge of the third side 413c.

Although FIG. 3 illustrates a case where only the sixth antenna element 471 is included in a side edge, embodiments of the present disclosure are not limited thereto and a seventh antenna element may be arranged on the opposite side edge. The seventh antenna element may be arranged at a position adjacent to the first antenna element 421. For example, the seventh antenna element may be arranged symmetrically with the sixth antenna element 471.

According to an embodiment, the first conductive member 420 and the second conductive member 430 may be connected in a region of the electronic device 400 (e.g., the electronic device 101 of FIG. 1). For example, the first conductive member 420 and the second conductive member 430 may be connected in one region 455 of the lower end of the electronic device 400. In this case, the first conductive member 420 and the second conductive member 430 may be U-shaped when viewed from the first surface 411.

According to an embodiment, a plurality of antenna elements may transmit/receive signals in the same frequency band or in different frequency bands. For example, the second and fourth antenna elements 422 and 432 may operate as Wi-Fi MIMO antennas. In another example, the second antenna element 422 may transmit/receive a GPS signal and the fourth antenna element 432 may transmit/receive an LTE signal.

Although the housing 410 having a rectangular parallelepiped shape is illustrated in FIG. 3, embodiments of the present disclosure are not limited thereto, and the housing 410 may have various shapes. Although the first conductive member 420 including the first antenna element 421 and the second antenna element 422 spaced apart from each other is illustrated in FIG. 3, the first conductive member 420 may further include one antenna element or three or more antenna elements.

Figure 4:
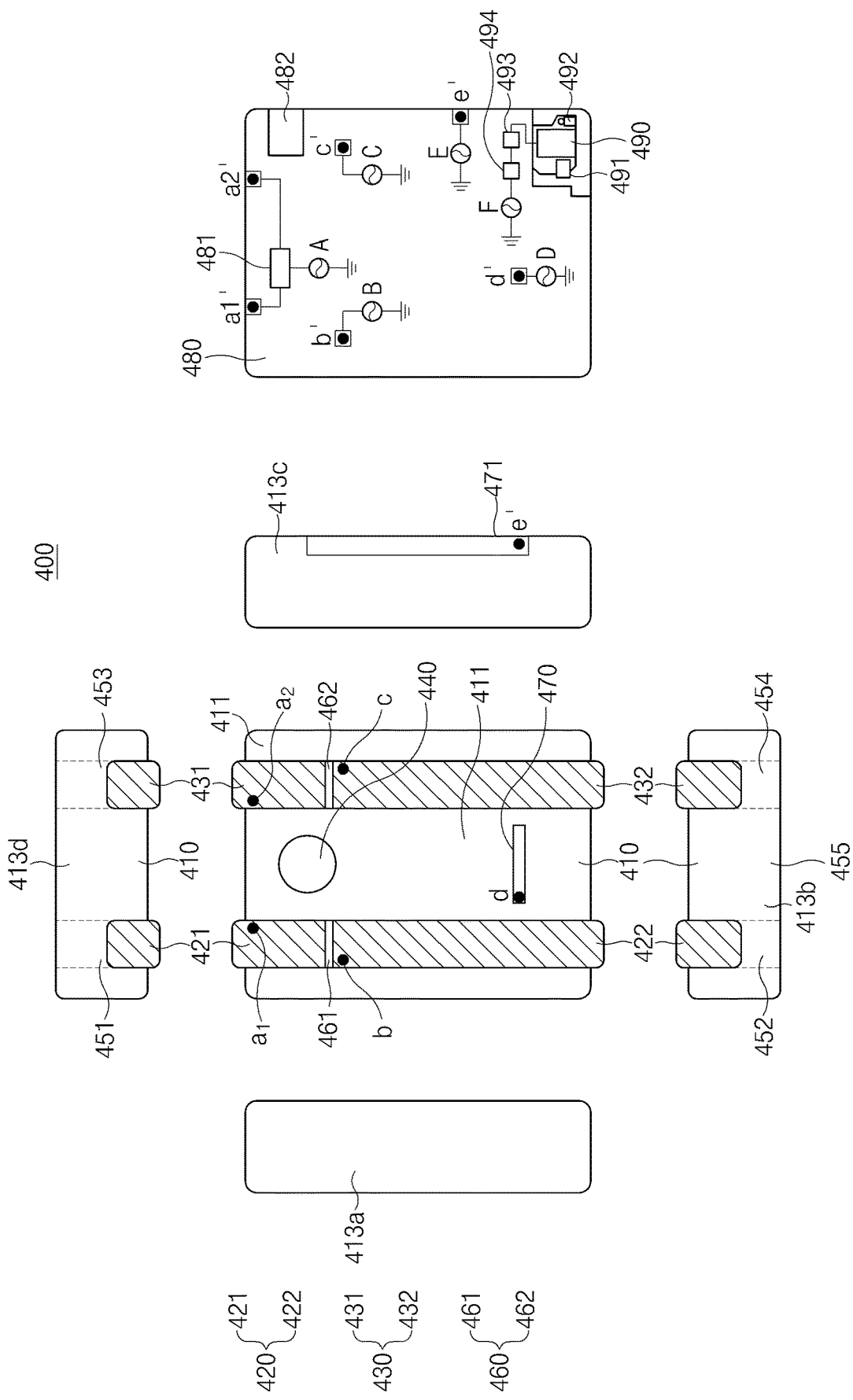
FIG. 4 is a view illustrating a feeding structure of an electronic device, according to an embodiment.

FIG. 4 is a view illustrating a feeding structure of an electronic device, according to an embodiment.

The electronic device 400 of FIG. 4 may be the same as or similar to the electronic device 400 of FIG. 2 or FIG. 3. For example, the first antenna element 421 of FIG. 4 may be the same as or similar to the first antenna element 421 of FIG. 2.

Referring to FIG. 4, the electronic device 400 may include a substrate 480 therein. According to an embodiment, the substrate 480 may be a printed circuit board (PCB). Various elements of the electronic device 400 such as a processor, a memory, or a communication circuit, may be arranged on the substrate 480.

A feeder for transmitting an electrical signal to at least one of the first to sixth antenna elements may be arranged on the substrate 480. For example, feeder "A" for supplying an electrical signal to the first antenna element 421 and/or the third antenna element 431, feeder "B" for supplying an electrical signal to the second antenna element 422, feeder "C" for supplying an electric signal to the fourth antenna element 432, feeder "D" for supplying an electric signal to the fifth antenna element 470, or feeder "E" for supplying an electrical signal to the sixth antenna element 471 may be arranged on the substrate 480.

At least one of the feeders "A" to "E" may be electrically connected to a wireless communication circuit or a radio frequency (RF) module (e.g., the communication module 190 of FIG. 1). The wireless communication circuit or the RF module may be arranged on the substrate 480.

According to an embodiment, at least one of the feeders "A" to "E" may be connected directly or indirectly to an antenna element associated therewith. For example, the feeder "C" may supply an electrical signal to point "c" on the fourth antenna element 432 through point "c'" of the substrate 480. According to an embodiment, the points "c" and "c'" may be connected to each other through a connecting member (e.g., a C-clip), a radiator, or a conductive line (or a conductive pattern). The fourth antenna element 432 may radiate the electrical signal received through the point "c" to an external space. According to another embodiment, the points "c" and "c'" may be in contact with each other.

According to an embodiment, the conductive line may be arranged in the housing 410 or on the substrate 480. The conductive line may be referenced as a PCB pattern. The radiator may be arranged inside or outside the housing 410. For example, at least a portion of the radiator may be arranged outside the housing 410 such that the radiator is connected to the first antenna element 421 and/or the third antenna element 431.

According to an embodiment, at least one of the first antenna element 421 or the second antenna element 422 may be connected to the feeder to enable the electronic device 400 to transmit/receive a signal. According to an embodiment, the feeder may selectively transmit an electrical signal to at least one point. For example, the feeder "A" may transmit an electrical signal to the antenna element connected thereto through one of points "a1'" and "a2'". The electronic device 400 may include a switch 481 for selecting one from the first antenna element 421 and the third antenna element 431. The switch 481 may selectively connect point "a1'" connected to point "a1" of the first antenna element 421 or point "a2'" connected to point "a2" of the third antenna element 431. The switch 481, for example, may be controlled by the processor 120 or a communication circuit.

According to various embodiments, the substrate 480 may further include at least one of an input/output interface 482 or a chip antenna 490.

According to an embodiment, the input/output interface 482 may be connected to the first antenna element 421 and/or the third antenna element 431. The first antenna element 421 and the third antenna element 431 may be short-circuited with each other through a metal portion of the input/output interface 482. The input/output interface 482, for example, may be a universal serial bus (USB) port.

According to an embodiment, the chip antenna 490 may have a length to transmit/receive a signal in a specific frequency band. For example, the specific frequency band may be an ultra-wide band (UWB) (e.g., 3.5 GHz to 6.5 GHz) through which a large amount of digital data can be transmitted.

According to various embodiments, the chip antenna 490 may be connected to a conductive pattern 491 formed on the substrate 480. The conductive pattern 491 may operate as an antenna stub for controlling an antenna resonant frequency. In the following description, the conductive pattern 491 may be referenced to as "stub" 491. The stub 491 may be connected to a pattern of the chip antenna 490 to control the antenna resonant frequency. The stub 491 may be electrically connected between the chip antenna 490 and a circuit board ground.

According to an embodiment, the stub 491 may be connected to a metal. Since the chip antenna 490 is surrounded by the metal, the performance of the chip antenna 490 may be deteriorated. According to an embodiment, the radiation performance of the chip antenna 490 may be improved by connecting the chip antenna 490 to the metal through a connecting member 492. The metal may be at least one of the conductive members. For example, the metal may be a portion of the fourth antenna element 432 or a portion of the sixth antenna element 471.

According to an embodiment, the chip antenna 490 may receive an electrical signal through the feeder. The feeder "F" may connect the chip antenna 490 to a feeding circuit and may be arranged on the substrate 480.

According to an embodiment, the connecting member 492 may be a conductive member such as a C-clip, a spring, a screw, and a metal plate.

According to an embodiment, the structure and configuration of the substrate 480 may be variously modified.

Figure 5:
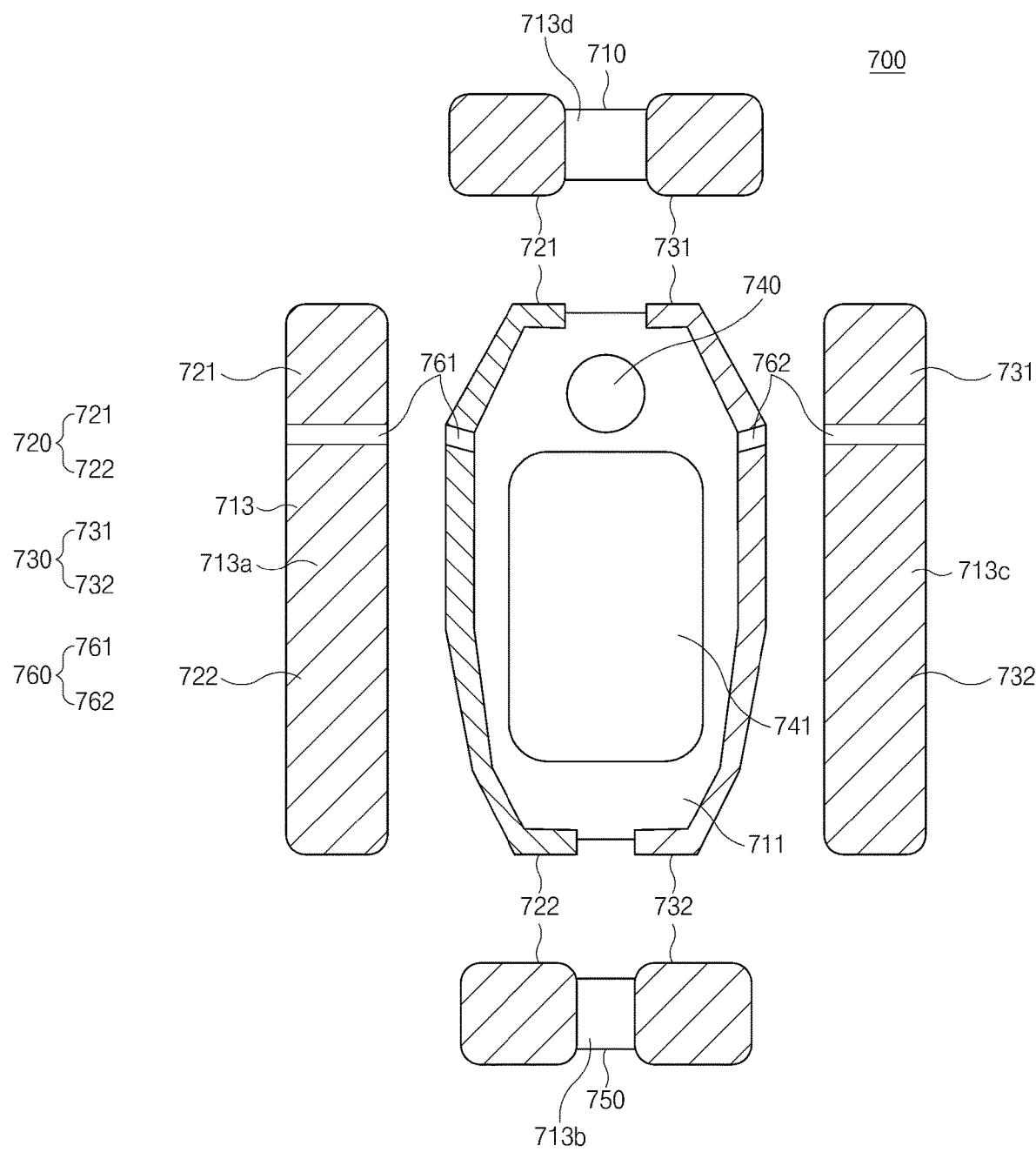
FIG. 5 is a view illustrating an external configuration of an electronic device, according to an embodiment.

FIG. 5 illustrates an external configuration of an electronic device, according to an embodiment.

Referring to FIG. 5, an electronic device 700 may include a housing 710, first and second conductive members 720 and 730, a control button 740, and a display 741. The housing 710 and the control button 740 may be the same as or similar to the housing 410 and the control button 440 of FIG. 2.

Referring to FIG. 5, the first and second conductive members 720 and 730 may be exposed outside the housing 710. For example, the first conductive member 720 and/or the second conductive member 730 may be a metal frame exposed outside the housing 710.

According to an embodiment, the housing 710 may include a first surface 711, a second surface facing away from the first surface 711, and a side surface 713 surrounding the space between the first surface 711 and the second surface. The control button 740 and the display 741 may be arranged on the first surface 711. The display 741 may display information about operations of an external device (e.g., the external device 10 of FIG. 2) on the electronic device 700. The side surface 713 may include first to fourth sides 713a to 713d. The first and third sides 713a and 713c may have lengths longer than the second and fourth sides 713b and 713d.

According to an embodiment, the first conductive member 720 may at least be arranged along the side surface 713 of the housing 710. The first conductive member 720 may extend along a first portion of the side surface 713 of the housing 710. For example, the first conductive member 720 may be arranged at least on the first side 713a when viewed from above the first surface 711 of the electronic device 700.

The first conductive member 720 may extend to the fourth side 713d or second side 713b along the first side 713a.

According to an embodiment, the first conductive member 720 may include first and second antenna elements 721 and 722 which are physically spaced apart from each other by at least one nonconductive member 761.

According to an embodiment, the second conductive member 730 may be exposed outside the housing 710 and may be arranged at least along the side surface 713 of the housing 710. The second conductive member 730 may extend long along a second portion of the side surface 713 of the housing 710. For example, the second conductive member 730 may be arranged at least on the third side 713c when viewed from above the first surface 711 of the electronic device 700. The second conductive member 730 may extend to the second or fourth side 713b or 713d.

According to an embodiment, the second conductive member 730 may include third antenna element 731 and fourth antenna element 732 physically spaced apart from each other by a nonconductive member 762.

The second conductive member 730 may have the same or a similar shape as the first conductive member 720. The first conductive member 720 and the second conductive member 730 may be physically spaced apart from each other by segmentation.

According to an embodiment, the electronic device 700 may include an open region 750 formed in the second side 713b between the second antenna element 722 and the fourth antenna element 732. The second antenna element 722 and the fourth antenna element 732 may be physically spaced apart from each other by the open region 750. The open region 750 may include a nonconductive member.

According to an embodiment, the first conductive member 720 and the second conductive member 730 of the electronic device 700 may be formed in a U-shape at least connected from the first side 713a to the third side 713c. The second antenna element 722 and the fourth antenna element 732 may be electrically connected to each other, thereby operating as one antenna element. The one antenna element may have a length to transmit/receive a signal of about 434 MHz or 868 MHz. The one antenna element may support a frequency allocated to be used for an RKE system or a similar service. The electronic device 700 may transmit/receive a Wi-Fi signal by using the first antenna element 721 and/or the third antenna element 731. The first antenna element 721 and the third antenna element 731 may operate as a multi-input multi-output (MIMO) antenna.

Figure 6:
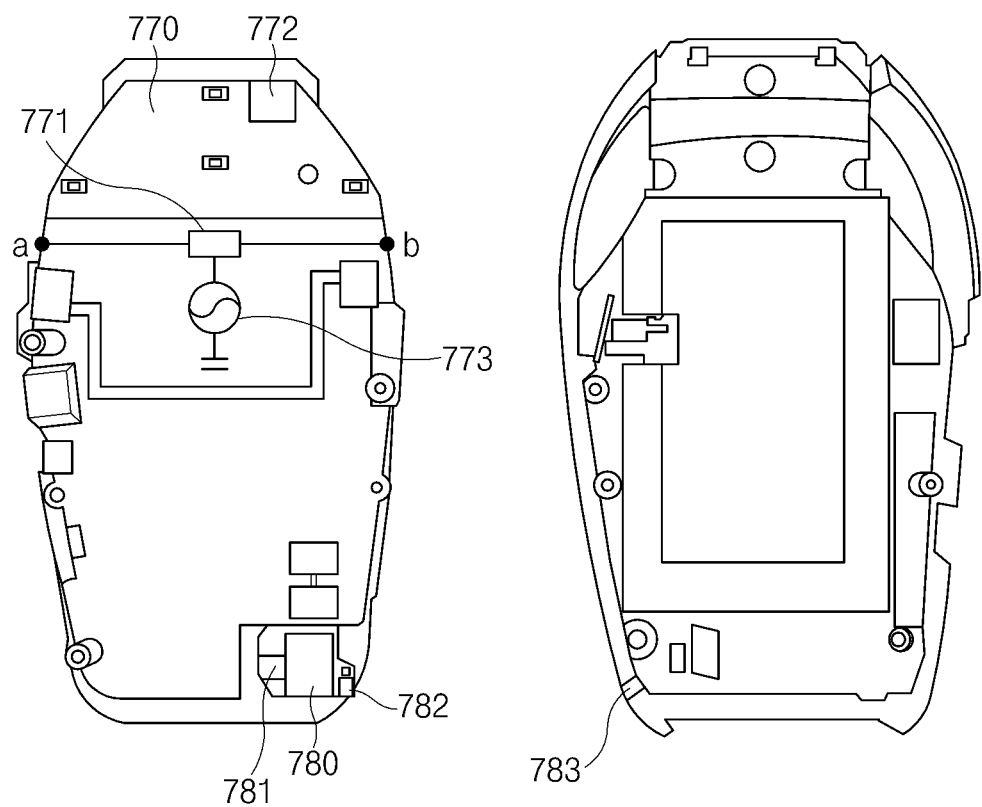
FIG. 6 is a view illustrating an inner substrate of an electronic device, according to an embodiment.

FIG. 6 is a view illustrating an inner structure of an electronic device, according to an embodiment.

The electronic device 700 of FIG. 6 may be the same as or similar to the electronic device 700 of FIG. 5. The first to fourth antenna elements may be the same as or similar to the first to fourth antenna elements 721 to 724 of FIG. 5.

Referring to FIG. 6, the electronic device 700 may include a substrate 770 therein. According to an embodiment, the substrate 770 may include a feeder 773 for supplying an electrical signal to at least one of the first to fourth antenna elements. The feeder 773 may be connected to a wireless communication circuit.

According to an embodiment, the feeder 773 may be connected to a switch 771 for selecting an antenna element. The switch 771 may select at least one of the first antenna element and the third antenna element of FIG. 5. The feeder 773 may supply an electrical signal to the antenna element connected to the switch 771.

According to various embodiments, the substrate 770 may include an input/output interface 772 and/or a chip antenna

780. Since the description of the input/output interface 772 and the chip antenna 780 is the same as that of the input/output interface 482 and the chip antenna 490 of FIG. 4, the details will be omitted for convenience.

According to an embodiment, the chip antenna 780 may be connected to a metal 783. The metal 783 may be at least one antenna element or a conductive member connected to the at least one antenna element. The metal 783 may be the fourth antenna element. In this case, the chip antenna 780 may be electrically connected to the fourth antenna element. The chip antenna 780 may be connected to the metal 783 through a connecting member 782. A stub 781 may be connected to the metal 783.

Figure 7:
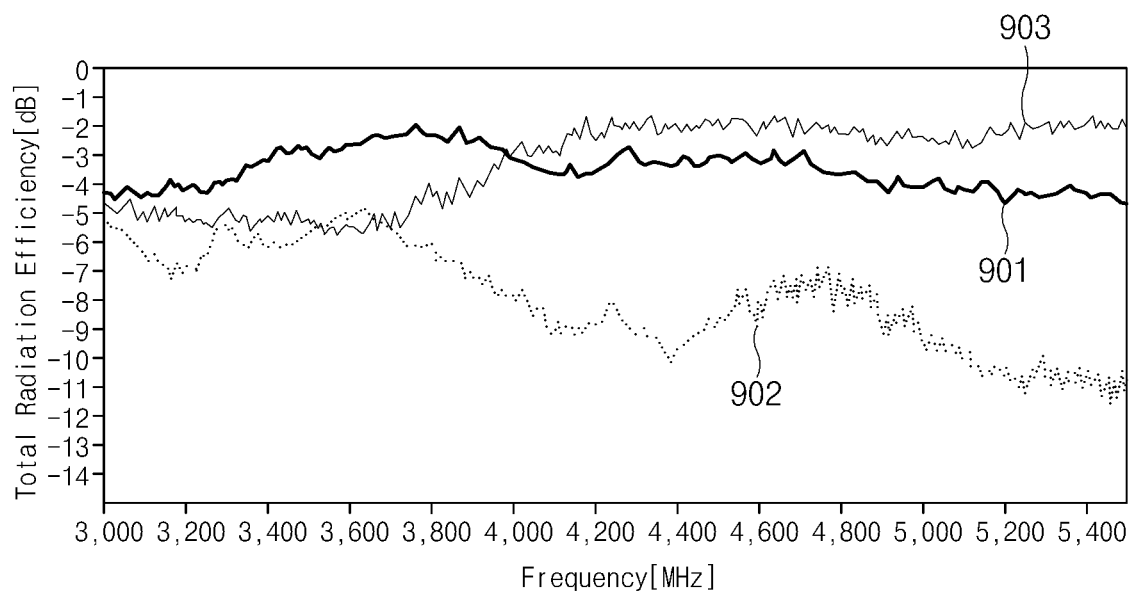
FIG. 7 is a graph illustrating antenna efficiency, according to an embodiment.

FIG. 7 is a graph illustrating antenna efficiency, according to an embodiment. In FIG. 7, graph 1 901 shows the antenna radiation efficiency of the UWB antenna according to a comparative example 1. Graph 2 902 shows the antenna radiation efficiency when the UWB antenna is mounted on the electronic device and the stub and the metal are not connected to each other according to a comparative example 2. Graph 3 903 shows the antenna radiation efficiency when the UWB antenna is mounted on the electronic device and the stub (e.g., the stub 781 of FIG. 6) and the metal (e.g., the metal 783 of FIG. 6) are connected to each other.

Referring to graph 2 902 and graph 3 903, when the stub and the metal are connected to each other, according to an embodiment, the radiation efficiency of the antenna at a high frequency is about 8 dB higher than that of the antenna radiation efficiency of comparative example 2. Referring to graph 1 901 and graph 3 903, when the stub and the metal are connected to each other, the radiation efficiency of the antenna is substantially equal to or superior to the radiation efficiency of the UWB antenna according to the comparative example 1. For example, as illustrated in FIG. 6, when the stub and the metal are connected to each other, the antenna performance may be improved.

According to various embodiments, when a portion of the housing of an electronic device (e.g., the electronic device 400 of FIG. 2 or the electronic device 700 of FIG. 5) is used as an antenna element, due to the limited space of the electronic device, it may be difficult to secure a sufficient electrical path for a target frequency. To form an electrical path having a sufficient length, the electronic device may include a radiator extending from at least one of the segmented conductive members.

Figure 8:
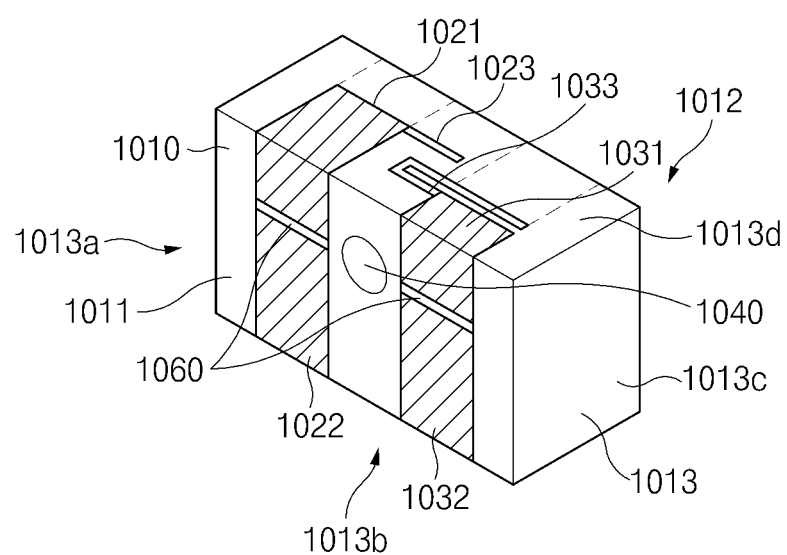
FIG. 8 is a view illustrating another configuration of an electronic device, according to an embodiment.

FIG. 8 is a view illustrating another configuration of an electronic device.

Referring to FIG. 8, an electronic device 1000 (e.g., the electronic device 400 of FIG. 2 or the electronic device 700 of FIG. 5) may include a housing 1010, a first antenna element 1021, a second antenna element 1022, a third antenna element 1031 and a fourth antenna element 1032 which are formed in the housing 1010 and distinguished from each other by a slit 1060, and a control button 1040. Since the housing 1010, the first antenna element 1021, the second antenna element 1022, the third antenna element 1031, the fourth antenna element 1032, and the control button 1040 are the same as or similar to the housing 410, the first, second, third, and fourth antenna elements 421, 422, 431, and 432, and the control button 440 of FIG. 2, the details will be omitted. The slit 1060 of FIG. 8 may be the same as or similar to the nonconductive member 460 of FIG. 2.

According to an embodiment, the housing 1010 may include a first surface 1011, a second surface 1012 facing away from the first surface 1011, and a side surface 1013 surrounding the space between the first surface 1011 and the second surface 1012. The side surface 1013 may include first to fourth sides 1013*a* to 1013*d*. The fourth side 1013*d* may be directed mainly to an external device (e.g., the external device 10 in FIG. 2) when a user uses the electronic device 1000.

According to an embodiment, the electronic device 1000 may further include a radiator. The radiator may be arranged outside or inside the housing 1010. The radiator may include a first radiator 1023 and a second radiator 1033. The electronic device 1000 may include the first radiator 1023 extending from the first antenna element 1021. The electronic device 1000 may include the second radiator 1033 extending from the third antenna element 1031.

According to an embodiment, the first radiator 1023 may extend from one point of the first antenna element 1021. At least a portion of the first radiator 1023 may be arranged along an inside of the housing 1010. For example, the first radiator 1023 may extend along an inside of the housing 1010 or may be a portion of an inside of the housing 1010.

According to an embodiment, the first radiator 1023 may be formed of a different material from that of the first antenna element 1021. For example, the first antenna element 1021 may be formed of a stiff material and the first radiator 1023 may be formed of a soft material. In another example, the first radiator 1023 may be formed through a process different from that of the first antenna element 1021.

According to an embodiment, the first radiator 1023 may be connected to the first antenna element 1021 through a connecting member. The connecting member may be arranged in the housing 1010 or the first radiator 1023. The connecting member may be a C-clip, a metal plate, a screw, or conductive foam.

According to an embodiment, when a user uses the electronic device 1000 to control the external device 10, the first radiator 1023 may be arranged predominantly in a direction toward the external device 10. For example, the first radiator 1023 may be arranged inside the fourth side 1013*d* (e.g., an upper side surface) of the side surface 1013 of the electronic device 1000. The first radiator 1023 may be arranged to be physically spaced apart from the third antenna element 1031 and/or the second radiator 1033. The first radiator 1023 and the second radiator 1033 may be electrically separated from each other.

According to an embodiment, the electronic device 1000 may transmit/receive a signal to/from an external device (e.g., the external device 10 of FIG. 2) by using both the first antenna element 1021 and the first radiator 1023. The electronic device 1000 may transmit/receive a signal at least in a first frequency band to/from an external device through a first electrical path including the first antenna element 1021 and the first radiator 1023. The first electrical path may have a predetermined electrical length to enable a signal to be transmitted/received at least in the first frequency band. According to an embodiment, the first electrical path may further include a first conductive line, and at least a portion of the first conductive line may be arranged on a substrate. A length of the first electrical path may be about $\lambda/3$ to about $\lambda/4$. An antenna using the first antenna element 1021 and the first radiator 1023 may be a monopole antenna or an inverted-F antenna (IFA) of $\lambda/4$.

According to an embodiment, the first frequency band may be a frequency band through which a signal can be transmitted/received between vehicles. For example, the first frequency band may be in a frequency range of 800 MHz to 900 MHz.

According to an embodiment, the second radiator 1033 may extend from one point of the third antenna element

1031. At least a portion of the second radiator 1033 may be arranged along an inside of the housing 1010. For example, the second radiator 1033 may extend along the inside of the housing 1010 and may be a portion of the inside of the housing 1010.

According to an embodiment, at least a portion of the second radiator 1033 may be formed of a material different from that of the third antenna element 1031. For example, the third antenna element 1031 may be formed of a stiff material and the second radiator 1033 may be formed of a soft material. In another example, the second radiator 1033 may be formed through a process different from that of the third antenna element 1031.

According to an embodiment, the second radiator 1033 may be connected to the third antenna element 1031 through a connecting member. The connecting member may be arranged in the housing 1010 or the second radiator 1033.

According to an embodiment, the second radiator 1033 may be arranged at least inside the fourth side 1013d of the housing 1010. The second radiator 1033 may be physically spaced apart from the first antenna element 1021 and the first radiator 1023.

According to an embodiment, the electronic device 1000 may transmit/receive a signal to/from an external device by using both the third antenna element 1031 and the second radiator 1033. The electronic device 1000 may transmit/receive a signal at least in a second frequency band to/from an external device through a second electrical path including the third antenna element 1031 and the second radiator 1033. The second electrical path may have an electrical length to enable a signal to be transmitted/received at least in the second frequency band.

According to an embodiment, the second electrical path may further include a second conductive line. The second conductive line may be arranged on a substrate. A third frequency band may be a frequency band for communicating with a vehicle. A length of the second electrical path may be about λ/3 to about λ/4. For example, an antenna using the third antenna element 1031 and the second radiator 1033 may be a monopole antenna or an IFA antenna of λ/4.

According to an embodiment, the second frequency band may be a frequency band different from the first frequency band, through which a signal can be transmitted/received between vehicles. For example, the second frequency band may be in a frequency range of 400 MHz to 500 MHz.

According to an embodiment, the length of the first electrical path may be shorter than that of the second electrical path. For example, the first electrical path may form a resonant frequency higher than the second electrical path. A signal in the first frequency band may be transmitted/received through the first electrical path and a signal of a lower frequency than that of the first electrical path may be transmitted/received through the second electrical path. For example, the first frequency band may be about 868 MHz and the second frequency band may be about 434 MHz.

Figure 9:
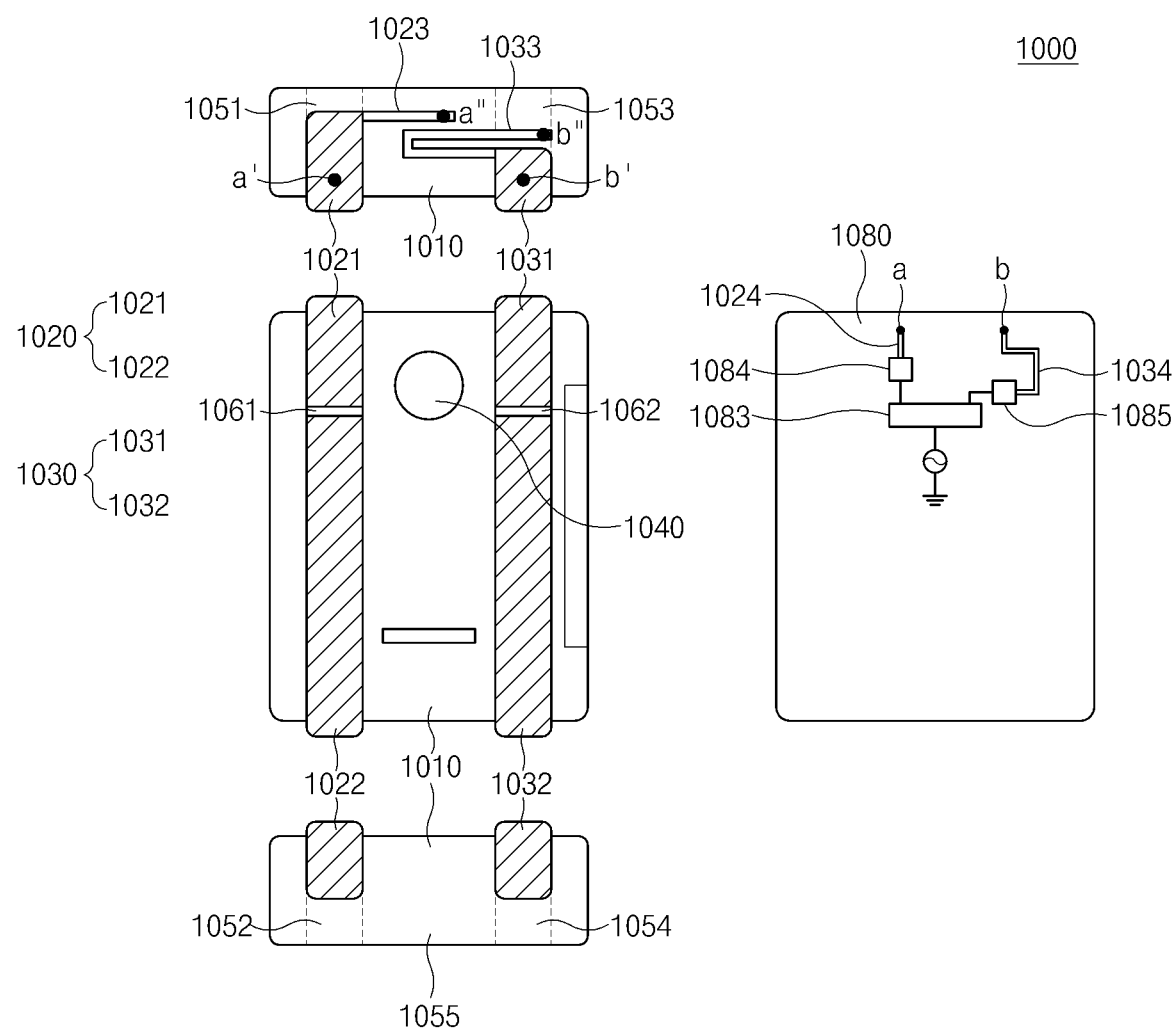
FIG. 9 is a view illustrating an internal structure of an electronic device, according to an embodiment.

FIG. 9 illustrates an internal structure of an electronic device, according to an embodiment.

The electronic device 1000 of FIG. 9 may be the same as or similar to the electronic device 1000 of FIG. 8.

Referring to FIG. 9, the electronic device 1000 may include a substrate 1080 in the housing 1010. A configuration for enabling the electronic device 1000 to transmit/receive a signal may be arranged on the substrate 1080. For example, a feeder for transmitting an electrical signal may be included on the substrate 1080. The feeder may transmit/receive a signal to/from the first electrical path and the second electrical path described in FIG. 8.

According to an embodiment, the substrate 1080 may include a switch 1083 for selecting the first electrical path or the second electrical path. The feeder may transmit an electrical signal to the electrical path selected by the switch 1083.

According to an embodiment, the first electrical path may include a first conductive pattern 1024. The first conductive pattern 1024 may be arranged in the housing 1010 of the electronic device 1000. For example, the first conductive pattern 1024 may be formed on the substrate 1080. The first conductive pattern 1024 may be referenced as a PCB pattern.

According to an embodiment, the first conductive pattern 1024 may be electrically connected to the first antenna element 1021 or the first radiator 1023. The first conductive pattern 1024 may be electrically connected to point "a''" of the first radiator 1023 or point "a'" of the first antenna element 1021. For example, the feeder may transmit an electrical signal to point "a" of the first radiator 1023 through point "a" of the first conductive pattern 1024. The electrical signal provided to the first radiator 1023 may be radiated to an external space at least through the first antenna element 1021 and the first radiator 1023.

According to an embodiment, the first conductive pattern 1024 may be electrically connected to point "a'" of the first antenna element 1021 or point "a" of the first radiator 1023 through the connecting member. For example, the connecting member may be arranged on the substrate 1080 or may be coupled to the first radiator 1023.

According to an embodiment, the second electrical path may include a second conductive pattern 1034. The second conductive pattern 1034 may be arranged in the housing 1010 of the electronic device 1000. The second conductive pattern 1034 may be formed on the substrate 1080 and may have an electrical length longer than the first conductive pattern 1024.

According to an embodiment, depending on the electrical lengths of the second radiator 1033 and the second conductive pattern 1034, the second electrical path may support a signal in a lower frequency band (e.g., about 434 MHz) than the first electrical path. For example, the first electrical path may support a signal in a relatively higher frequency band (e.g., about 868 MHz) than the second electrical path. Although the third antenna element 1031 having a shorter length than the first antenna element 1021 is illustrated in FIG. 9, the length of the antenna element may be varied.

According to an embodiment, the second conductive pattern 1034 may be electrically connected to the third antenna element 1031 or the second radiator 1033. Point "b" of the second conductive pattern 1034 may be electrically connected to point "b" of the second radiator 1033 or point "b'" of the third antenna element 1031. An electrical signal may be transmitted to point "b''" of the second radiator 1033 through point "b" of the second conductive pattern 1034. The electrical signal provided to the second radiator 1033 may be radiated to an external space at least through the third antenna element 1031 and the second radiator 1033. In another example, the feeder may transmit an electrical signal to point "b'" of the third antenna element 1031 through point "b" of the second conductive pattern 1034.

According to an embodiment, the second conductive pattern 1034 may be electrically connected to point "b'" of the third antenna element 1031 or point "b''" of the second radiator 1033 through the connecting member. For example, the connecting member may be arranged on the substrate 1080 or may be coupled to the second radiator 1033.

According to an embodiment, the first conductive pattern 1024 may be connected to the switch 1083 through a first matching circuit 1084. The second conductive pattern 1034 may be connected to the switch 1083 through a second matching circuit 1085. The switch 1083 may select one of the first electrical path and the second electrical path, and be connected to one of the first matching circuit 1084 or the second matching circuit 1085. The switch 1083 may be electrically connected to a processor (e.g., the processor 120 of FIG. 1) or a communication circuit (e.g., the communication module 190 of FIG. 1). The processor may be arranged on the substrate 1080.

Figure 10:
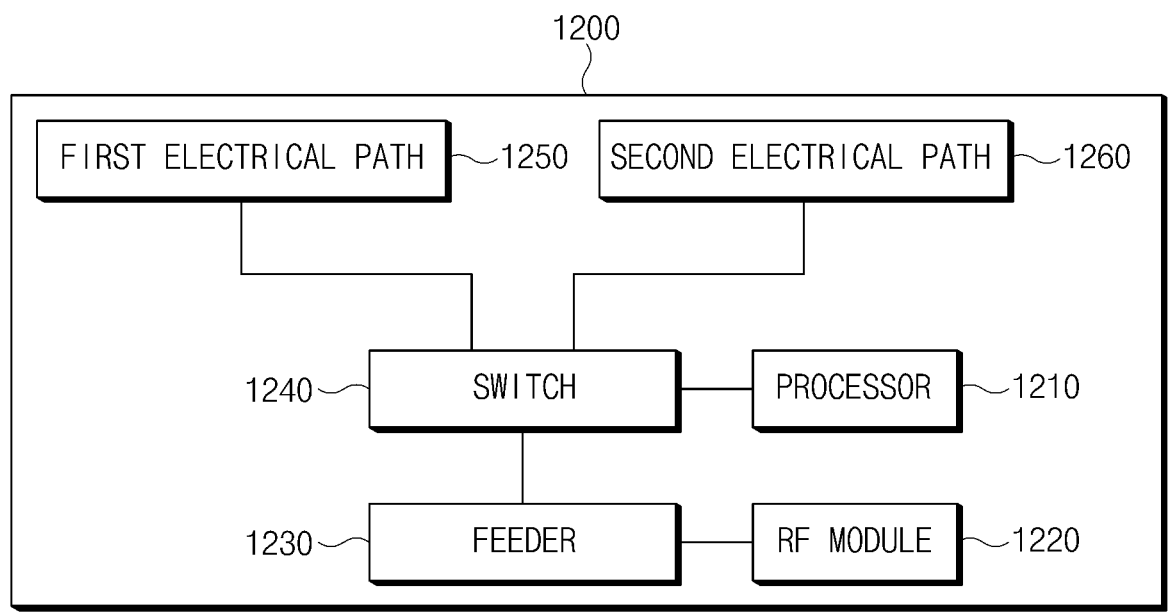
FIG. 10 is a block diagram illustrating a configuration of an electronic device, according to an embodiment.

FIG. 10 is a block diagram illustrating an electrical device, according to an embodiment.

Referring to FIG. 10, an electronic device 1200 may include a processor 1210, an RF module 1220, a feeder 1230, a switch 1240, a first electrical path 1250, and/or a second electrical path 1260. The electronic device 1200 may select one of the first electrical path 1250 and the second electrical path 1260 to communicate with an external device (e.g., the external device 10 of FIG. 2).

The configuration of the electronic device 1200 illustrated in FIG. 10 is exemplary and may be variously modified to implement various embodiments disclosed in the preset disclosure. For example, the electronic device 1200 may include a configuration such as the configuration of the electronic device 100 of FIG. 1, the configuration of the electronic device 400 of FIG. 2, the configuration of the electronic device 700 of FIG. 5, the configuration of the electronic device 1000 of FIG. 8, or may be appropriately modified by utilizing aspects of these configurations.

According to an embodiment, the processor 1210 (e.g., the processor 120 of FIG. 1) may control the switch 1240. The processor 1210 may be arranged on a substrate (e.g., the substrate 480 in FIG. 4). The processor 1210 may be connected to a memory (e.g., the memory 130 of FIG. 1). The processor 1210 may perform operations of the electronic device 1200 or control other elements in accordance with instructions stored in the memory. For example, the processor 1210 may select one from the first electrical path 1250 or the second electrical path 1260 in accordance with the request of a manufacturer. The processor 1210 may allow the manufacturer to select only one of the first electrical path 1250 or the second electrical path 1260.

According to an embodiment, the RF module 1220 may transmit an electrical signal to the feeder 1230. The RF module 1220 may transmit a signal to the first electrical path 1250 or the second electrical path 1260 under control of the processor 1210. Further, the RF module 1220 may control the switch 1240.

According to an embodiment, the feeder 1230 may transmit an electrical signal to the path selected by the switch 1240. The feeder 1230 may transmit an electrical signal from RF module 1220 to the first electrical path 1250 or the second electrical path 1260. According to one embodiment, the feeder 1230 may be arranged on the substrate.

According to an embodiment, the switch 1240 may be selectively connected to one of the first electrical path 1250 or the second electrical path 1260. In an embodiment, the switch 1240 may be arranged on the substrate.

According to an embodiment, the first electrical path 1250 may include at least an antenna element (e.g., the first antenna element 421 of FIG. 2 or the first antenna element 721 of FIG. 5). The first electrical path 1250 may include a radiator (e.g., the first radiator 1023 of FIG. 9) extending from the at least one antenna element. The first electrical path 1250 may further include a conductive line or a conductive pattern (e.g., the first conductive pattern 1024 of FIG. 9).

According to an embodiment, the second electrical path 1260 may include at least an antenna element (e.g., the third antenna element 431 of FIG. 2 or the third antenna element 731 of FIG. 5). The second electrical path 1260 may further include a radiator (e.g., the second radiator 1033 of FIG. 9). The second electrical path 1260 may further include a conductive line or a conductive pattern (e.g., the second conductive pattern 1034 of FIG. 9).

The electronic device 1200 may comply with various communication standards that define communication with an external device. According to an embodiment, in Europe, 434 MHz is allocated for communication with an external device. In other countries, 868 MHz may be allocated for communication with an external device. The electronic device 1200 disclosed in the present disclosure may support communication of various standards, thereby reducing the cost of the production process.

An electronic device (e.g., the electronic device 1000 of FIG. 8) according to an embodiment of the present disclosure may include a housing (e.g., the housing 1010 of FIG. 8) surrounding the electronic device, a wireless communication circuit (e.g., the RF module 1220 of FIG. 10) positioned in the housing to communicate with a vehicle (e.g., the external device 10 of FIG. 2), a first antenna element (e.g., the first antenna element 1021 of FIG. 8) electrically connected to the wireless communication circuit and extending along a first portion of the housing, a second antenna element (e.g., the third antenna element 1031 of FIG. 8) electrically connected to the wireless communication circuit and extending along a second portion of the housing, a first radiator (e.g., the first radiator 1023 of FIG. 8) extending from the first antenna element, and a switch (e.g., the switch 1240 of FIG. 10) selectively connected to a first electrical path including the first antenna element and the first radiator or a second electrical path including the second antenna element. The wireless communication circuit may be configured to wirelessly communicate with the vehicle by using the path selected by the switch.

According to an embodiment, the second electrical path may include a second radiator which is physically spaced apart from the first radiator and extends from the second antenna element.

According to an embodiment, a printed circuit board on which at least a portion of a conductive line (e.g., the first conductive pattern 1024 of FIG. 9) is arranged may be included in the housing, and the first electrical path may include the conductive line.

According to an embodiment, the first electrical path may have an electrical length for transmitting or receiving at least a signal in the first frequency band, and the second electrical path may have an electrical length for transmitting or receiving at least a signal in the second frequency band which is distinguished from the first frequency band.

According to an embodiment, the switch may be connected to the first antenna element or the first radiator.

According to an embodiment, the electronic device may further include a third antenna element (e.g., the sixth antenna element 471 of FIG. 3) extending along a third portion of the housing, and the wireless communication circuit may transmit or receive a signal in a third frequency band different from the first frequency band by using the third antenna element.

According to an embodiment, the signal in the third frequency band may include a cellular signal, a Bluetooth low energy (BLE) signal, a wireless-fidelity (Wi-Fi) signal, or a global positioning system (GPS) signal.

According to an embodiment, the third antenna element may be coupled with the second antenna element.

According to an embodiment, the electronic device may further include a fourth antenna element (e.g., the second antenna element 1022 of FIG. 8) extending along a fourth portion of the housing and physically spaced apart from the third portion, and the wireless communication circuit may transmit or receive a signal in the fourth frequency signal band by using the fourth antenna element According to an embodiment, the electronic device may include a chip antenna (e.g., the chip antenna 490 of FIG. 4) in the housing, and the wireless communication circuit may transmit or receive a signal by using the chip antenna.

According to an embodiment, the electronic device may include a stub (e.g., the stub 491 of FIG. 4) surrounding the chip antenna, where the stub may be electrically connected to the first antenna element or the second antenna element.

According to an embodiment, the housing may include a withdrawal member (e.g., a withdrawal member 1330 of FIG. 12), at least a portion of which is arranged inside the housing in a first state and outside the housing in a second state, and the wireless communication circuit may transmit or receive a signal by using the withdrawal member in at least one of the first state or the second state.

According to an embodiment, the second electrical path may include the withdrawal member in at least one of the first state or the second state.

According to an embodiment of the present disclosure, an electronic device (e.g., the electronic device 1000 of FIG. 8) may include a housing (e.g., the housing 1010 of FIG. 8) including a first surface (e.g., the first surface 1011 of FIG. 8), a second surface (e.g., the second surface 1012 of FIG. 8) facing away from the first surface, and a side surface (e.g., the side surface 1013 of FIG. 8) surrounding a space between the first surface and the second surface, a wireless communication circuit (e.g., the RF module 1220 of FIG. 10) positioned inside the housing and configured to communicate with a key system of a vehicle (e.g., the external device 10 of FIG. 2), a first conductive member (e.g., the first conductive member 1020 of FIG. 9) extending long along a first portion of the side surface, a second conductive member (e.g., the second conductive member 1030 of FIG. 9) extending long along a second portion of the side surface, and a conductive pattern (e.g., the conductive pattern 1024 and 1025 of FIG. 9) positioned in the housing. The wireless communication circuit may be configured to communicate with the key system by using at least a portion of the conductive pattern, and only one of the first conductive member or the second conductive member.

According to an embodiment, the conductive pattern includes a first portion and a second portion electrically separated from each other.

According to an embodiment, the first conductive member and the first portion may both be configured to provide an electrical path having a specific length.

According to an embodiment, the first conductive member and the first portion may both be configured to support a frequency allocated to be used for a remote keyless entry (RKE) system or a service similar to the RKE system.

According to an embodiment, the second conductive member and the second portion may be configured to provide an electrical path having a specific length.

According to an embodiment, the second conductive member and the second portion may both be configured to support a frequency allocated to be used for the RKE system or a service similar to the RKE system.

According to an embodiment, the electronic device may further include a memory (e.g., the memory 130 of FIG. 1) for storing instructions that allow a manufacturer to select one of the first conductive member or the second conductive member.

Figure 11:
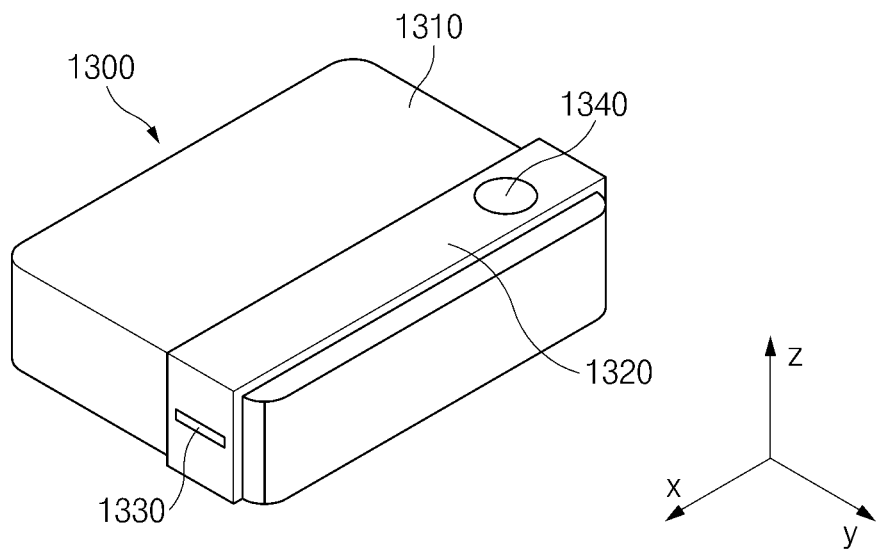
FIG. 11 is a view illustrating an outer appearance of an electronic device, according to an embodiment.
Figure 11:
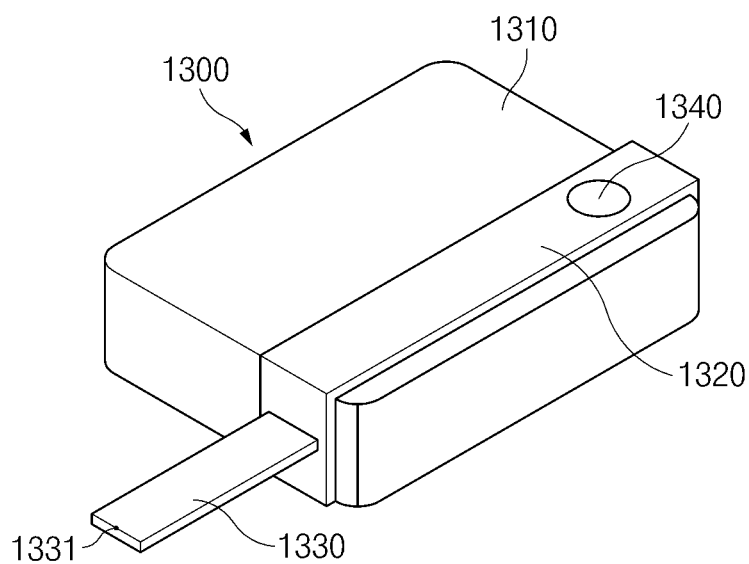

FIG. 11 is a view illustrating an outer appearance of an electronic device, according to an embodiment.

Referring to FIG. 11, an electronic device 1300 may include a housing 1310, an antenna element 1320, a withdrawal member 1330, and a control button 1340.

According to an embodiment, the electronic device 1300 (e.g., the electronic device 400 of FIG. 2, the electronic device 400 of FIG. 3, the electronic device 400 of FIG. 4, the electronic device 700 of FIG. 5, the electronic device 700 of FIG. 6, the electronic device 1000 of FIG. 8, the electronic device 1000 of FIG. 9, or the electronic device 1200 of FIG. 10) may operate to allow at least a portion of the withdrawal member 1330 to be positioned in the housing 1310 in a first state 1301. The electronic device 1300 may operate to allow the withdrawal member 1330 constituting a portion of the housing 1310 to be exposed outside the housing 1310 or separated from the housing 1310 in a second state 1302. The withdrawal member 1330, for example, may be a physical key of a vehicle.

According to an embodiment, the electronic device 1300 may change the operation state when an input is generated from the control button 1340 by a user. For example, when the input is generated from the control button 1340, the operating state of the electronic device 1300 operating in the first state 1301 may be changed from the first state 1301 to the second state 1302 so that the electronic device 1300 operates in the second state 1302. Further, the operating state of the electronic device 1300 operating in the second state 1302 may also be changed to the first state 1301 by the control button 1340. The operating state of the electronic device 1000 may be changed by a physical pressure.

According to an embodiment, the housing 1310 may surround elements of the electronic device 1300. Although the housing 1310 having a rectangular parallelepiped shape is illustrated in FIG. 11, the embodiment is not limited thereto, and the housing 1310 may have various shapes. The housing 1310 may include a hole, through which the withdrawal member 1330 moves, in a region thereof, or may include a region to allow the withdrawal member 1330 to be attached to an outer portion of the housing 1310.

According to various embodiments, the antenna element 1320 may be exposed outside the housing 1310. For example, the antenna element 1320 may be a metal frame exposed outside the housing 1310. The antenna element 1320 may be arranged to extend along at least a portion of a front surface of the housing 1310. In addition, the antenna element 1320 may be arranged in the housing 1310 in various shapes.

According to an embodiment, the withdrawal member 1330 may include a conductive member in at least a region thereof. For example, the withdrawal member 1330 may be entirely made of a conductive member. The withdrawal member 1330 may move along the inside of the housing 1310, or a region of the withdrawal member 1330 may be detachably attached to the outside of the housing 1310.

According to various embodiments, the withdrawal member 1330 may operate as an antenna element in at least one of the first state 1301 or the second state 1302. According to an embodiment, in the first state 1301, the withdrawal member 1330 may be connected to the housing 1310 through one point. The withdrawal member 1330 may be electrically connected to the antenna element 1320 in the first state 1301. The one point may be connected to the antenna element 1320 through a connecting member.

In the second state 1302, the one point may be one point 1331 that is exposed outside of the housing 1310 at least. The one point 1331 may be a point connected to or included in the housing 1310 only in the first state 1301.

According to an embodiment, in the second state 1302, the withdrawal member 1330 may operate as an antenna element. The withdrawal member 1330 may be electrically connected to the antenna element 1320 through another point different from the one point 1331 in the second state 1302.

The configuration of the electronic device 1300 illustrated in FIG. 11 may be modified to implement various embodiments described in the present disclosure.

Figure 12:
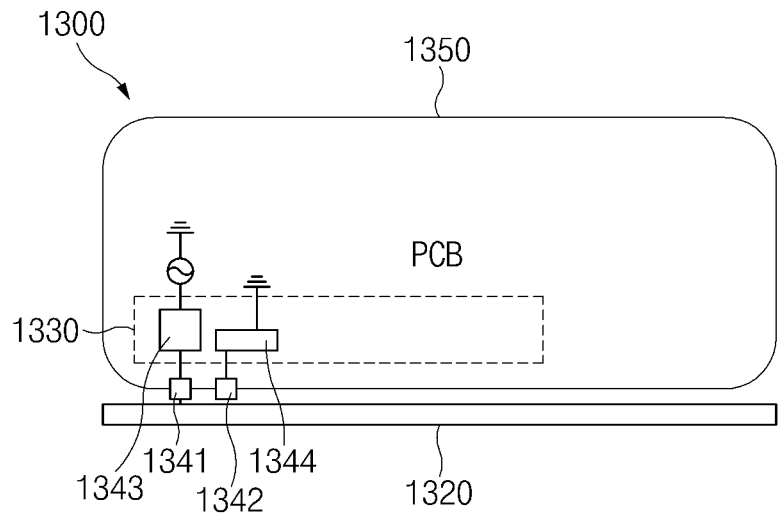
FIG. 12 is a view illustrating an antenna structure of an electronic device, according to an embodiment.
Figure 12:
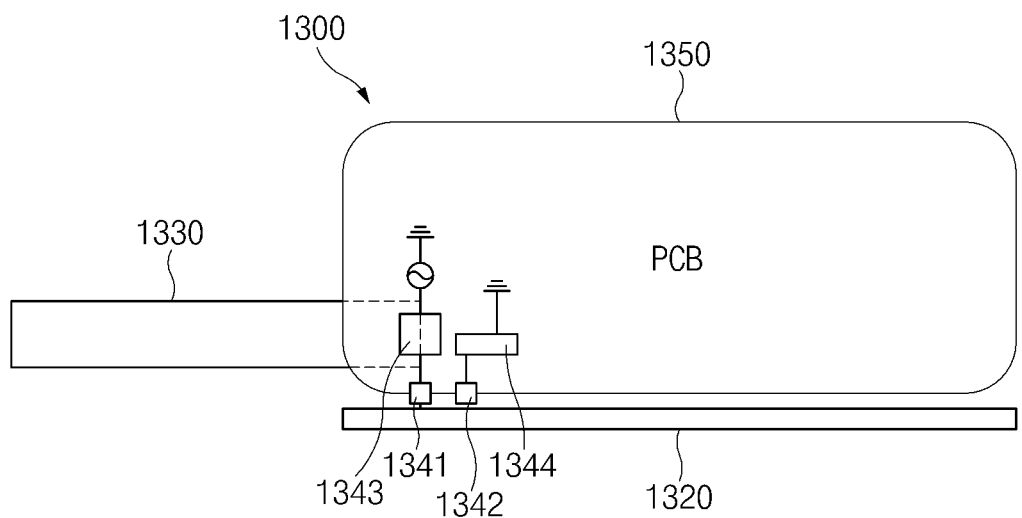

FIG. 12 illustrates an antenna structure in accordance with a state of an electronic device.

Referring to FIG. 12, the electronic device 1300 (e.g., the electronic device 1300 of FIG. 11) may have antenna structures different from each other in the first state 1301 and the second state 1302. For example, the electronic device 1300 may have antenna structures different from each other at least based on a position of the withdrawal member 1330.

According to an embodiment, in the first state 1301, the antenna element 1320 and/or the withdrawal member 1330 of the electronic device 1300 may operate as a planar inverted-F antenna (PIFA) or a monopole antenna. In the first state 1301, the feeder of the electronic device 1300 may be connected to the antenna element 1320. When the antenna element 1320 is electrically connected to a ground while the feeder supplies an electrical signal to the antenna element 1320, the electronic device 1300 may operate as the PIFA. When the antenna element 1320 is not connected to a ground while the feeder supplies an electrical signal to the antenna element 1320, the electronic device 1300 may operate as the monopole antenna. When the antenna element 1320 is connected to the ground so that the antenna element 1320 operates as the PIFA antenna, the antenna element 1320 may have an electrical length of λ/4 to transmit or receive a signal of a target frequency. When the antenna element 1320 operates as the monopole antenna, an image plane may be formed between the withdrawal member 1330 and the antenna element 1320.

According to an embodiment, the electronic device 1300 may include a switch 1344 configured to select an antenna type. The switch 1344 may control the connection of the electrical path between the ground and the antenna element 1320. For example, the switch 1344 may be connected to a processor (e.g., the processor 120 of FIG. 1 or the processor 1210 of FIG. 10), where the processor may select the PIFA or the monopole antenna based on a communication requirement. For example, the processor may turn on the switch 1344 to operate as the PIFA, and may turn off the switch 1344 to operate as the monopole antenna.

According to an embodiment, in the second state 1302, the antenna element 1320 and/or the withdrawal member 1330 of the electronic device 1300 may operate as the PIFA or a dipole antenna. In the second state 1302, the feeder of the electronic device 1300 may be connected to the antenna element 1320. When the antenna element 1320 is electrically connected to the ground, the electronic device 1300 may operate as the PIFA. When the connection between the antenna element 1320 and the ground is broken, the electronic device 1300 may operate as the dipole antenna.

According to an embodiment, the switch 1344 may select the PIFA or the dipole antenna under control of the processor. For example, when the switch 1344 is turned on, the antenna element 1320 may be connected to the ground, and the antenna element 1320 and the withdrawal member 1330 may operate as the PIFA. When the switch 1344 is turned off, the connection between the antenna element 1320 and the ground is broken, and the antenna element 1320 and the withdrawal member 1330 may operate as the dipole antenna.

According to an embodiment, the switch 1344 may be connected to the antenna element 1320 through a second connector 1342. The second connector 1342, according to an embodiment, may be arranged on the antenna element 1320. For example, the second connector 1342 may include a connecting member such as a C-clip.

According to an embodiment, the feeder may be connected to the antenna element 1320 through a first connector 1341 and/or a matching circuit 1343. According to an embodiment, the first connector 1341 may include a connecting member such as a C-clip. The feeder may supply an electrical signal to the antenna element 1320 without regard to the on/off state of the switch 1344. The feeder may transmit an electrical signal from a communication circuit (e.g., the communication module 190 of FIG. 1 or the RF module 1220 of FIG. 10) to the antenna element 1320.

According to an embodiment, the ground may be connected to a ground surface formed on a PCB 1350. The PCB 1350, according to an embodiment, may include the matching circuit 1343, the switch 1344, the ground, or the feeder. The PCB 1350 may include various configurations different from that of FIG. 12. For example, the PCB 1350 may further include a configuration such as a processor and/or an RF module.

According to an embodiment, in the second state 1302, the electronic device 1300 may transmit/receive a signal by using the antenna element 1320 and the withdrawal member 1330 (or, a conductive member of the withdrawal member 1330). In the second state 1302, the withdrawal member 1330 may be connected to the antenna element 1320 through the first connector 1341 and/or the maiching circuit 1343 such that the withdrawal member 1330 is utilized as an antenna radiator.

According to an embodiment, in the second state 1302, the withdrawal member 1330 and the antenna element 1320 may be connected to each other so that the physical size of the antenna is enlarged, and the antenna may be exposed outside so that an effect on the human body (e.g., interference caused by a hand) is reduced, thereby improving the efficiency of signal transmission/reception with an external device (e.g., the external device 10 of FIG. 2).

According to an embodiment, the position of the feeder may be changed through control of the processor. When operation switching occurs between the first state 1301 and the second state 1302, the processor of the electronic device 1300 may change the position(s) of the ground and/or the feeder connected to the antenna element 1320 or the withdrawal member 1330, or the processor may change the point at which the antenna element 1320 or the withdrawal member 1330 connected to the ground and/or the feeder. For example, when a user input of the control button 1340 is recognized, the antenna element 1320 may be connected to the feeder and/or the ground, which is/are located near the point at which the withdrawal member 1330 is exposed, instead of the feeder and/or the ground which is/are arranged away from the point at which the withdrawal member 1330 is exposed.

Figure 13:
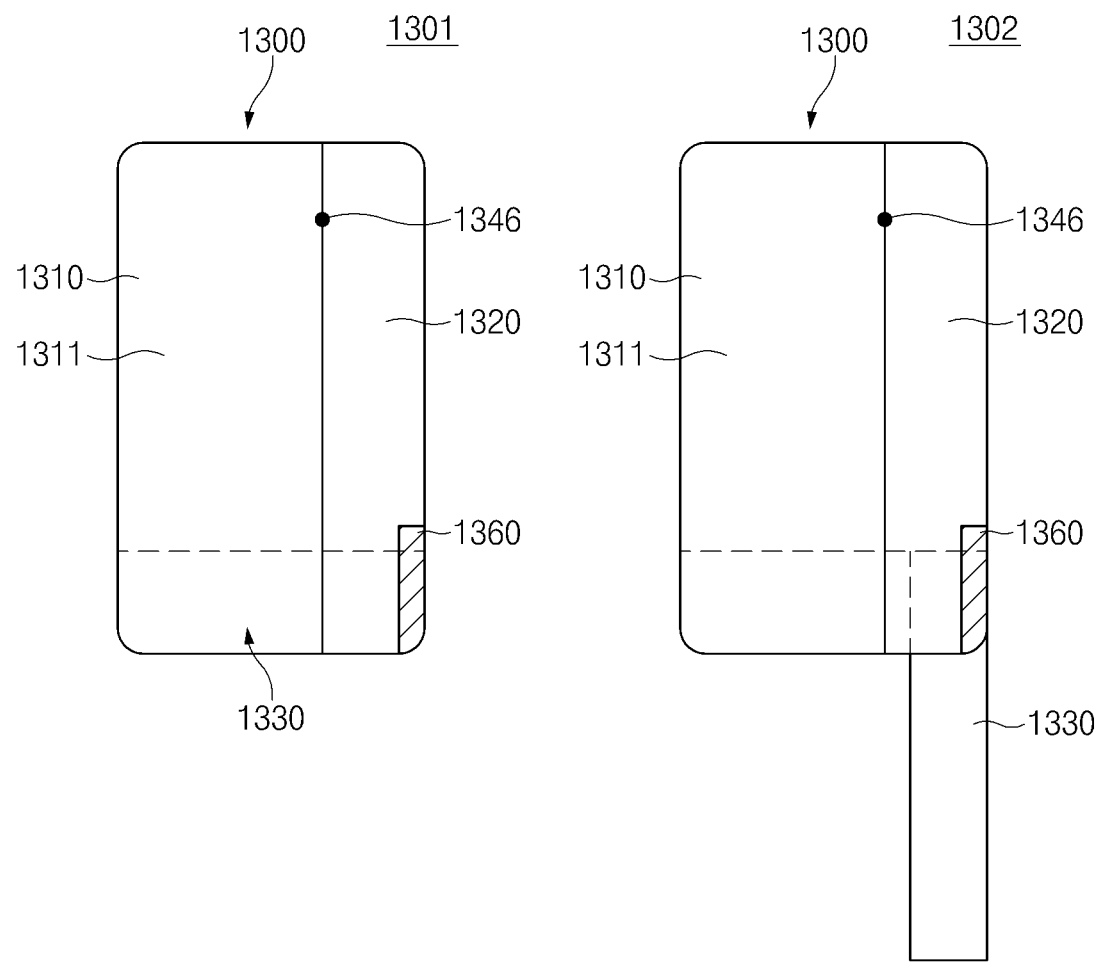
FIG. 13 is a view illustrating an antenna structure of an electronic device, according to an embodiment.

FIG. 13 illustrates an antenna structure of an electronic device, according to an embodiment.

Referring to FIG. 13, in the first state 1301 and the second state 1302, the electronic device 1300 (e.g., the electronic device 100 of FIG. 1, the electronic device 400 of FIG. 2, the electronic device 700 of FIG. 5, the electronic device 1000 of FIG. 8, or the electronic device 1300 of FIG. 12) may transmit/receive a signal of a target frequency by using an electrical path including the withdrawal member 1330 and the antenna element 1320.

According to an embodiment, in the first state 1301, the withdrawal member 1330 may be arranged to allow the electrical path to extend from the antenna element 1320 in the housing 1310. When viewed from a first surface 1311 of the housing 1310, the withdrawal member 1330 may be arranged not to fully overlap the antenna element 1320. For example, the withdrawal member 1330 may be arranged to form a non-zero angle (e.g., 90 degrees) with the antenna element 1320. Although the case where the withdrawal member 1330 is embedded in the housing 1310 in the first state 1301 is exemplarily illustrated in FIG. 13, the withdrawal member 1330 may also be located outside the housing 1310, the following embodiments may be applied even when the withdrawal member 1330 is detached from the housing 1310.

According to an embodiment, in the second state 1302, the withdrawal member 1330 may be ejected out of the housing 1310. In the second state 1302, the electronic device 1300 may transmit/receive a signal of a target frequency through an electrical path including the withdrawal member 1330 and the antenna element 1320. In the second state 1302, the withdrawal member 1330 may be arranged such that a specific point (e.g., the point first making contact with an air layer) of the withdrawal member 1330 is located furthest away from the antenna element 1320.

According to an embodiment, in the first state 1301 and/or the second state 1302, the feeder of the electronic device 1300 may be connected to the antenna element 1320. For example, in the first state 1301, the feeder of the electronic device 1300 may transmit an electrical signal to one point 1346 of the antenna element 1320.

According to an embodiment, the antenna lengths in the first state 1301 and the second state 1302 may be the same. However, although the antenna lengths in the first state 1301 and the second state 1302 are the same, the antenna performance may be better in the second state 1302.

According to an embodiment, the electronic device 1300 may further include a hinge 1360 for movement of the withdrawal member 1330 in the first state 1301 and the second state 1302. The hinge 1360 may be connected to the antenna element 1320 and the withdrawal member 1330.

At least a part of an apparatus (e.g., modules or functions thereof) or a method (e.g., operations) according to various embodiments may be, for example, implemented by instructions stored in a computer-readable storage media (e.g., the memory 130) in the form of a program module. The instructions, when executed by a processor (e.g., the processor 120), may cause the processor to perform a function or command corresponding to the instruction. The computer-readable recording medium may include a hard disk, a floppy disk, a magnetic media (e.g., a magnetic tape), an optical media (e.g., a compact disc read only memory (CD-ROM), a digital versatile disc (DVD), or a magneto-optical media (e.g., a floptical disk)), and an embedded memory. The one or more instructions may contain a code (i.e., a command) created by a compiler or a code executable by an interpreter.

Each element (e.g., a module or a program module), according to various embodiments, may be composed of single entity or a plurality of entities, a part of the above-described elements may be omitted, or other parts of elements may further be included. Additionally or alternatively, after being integrated in one entity, some elements (e.g., a module or a program module) may identically or similarly perform the function executed by each corresponding element before integration. According to various embodiments, operations executed by modules, program modules, or other elements may be executed by a successive method, a parallel method, a repeated method, or a heuristic method, or at least one part of an operation may be executed in a different sequence or may be omitted. Alternatively, other operations may be added.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic vehicular key device comprising:
   a housing surrounding the electronic device;
   a physical key retractable from the housing and electrically connected with an antenna element;
   the antenna element extending along a front surface of the housing and comprising a first point located at the antenna element;
   a switch selectively connecting a second point of the antenna element with a ground; and
   a wireless communication circuit positioned in the housing and electrically connected with the antenna element at the first point of the antenna element, wherein the wireless communication circuit is configured to:
   operate in a first state when the physical key is disposed in the housing, and
   operate in a second state when the physical key is exposed out of the housing.

2. The electronic vehicular key device of claim 1, wherein the physical key is retractable through an opening of the antenna element.

3. The electronic vehicular key device of claim 1, further comprising:
   a printed circuit board including a conductive line, at least a portion of which is arranged in the housing,
   wherein the ground is disposed in the printed circuit board.

4. The electronic vehicular key device of claim 1, further comprising a processor,
   wherein, in the first state, the processor is configured to control the switch to:
   connect the antenna element to the ground to operate the antenna element and the physical key as a planar inverted F antenna (PIFA), and
   disconnect the antenna element from the ground to operate the antenna element and the physical key as a monopole antenna.

5. The electronic vehicular key device of claim 4, wherein the wireless communication circuit is further configured to supply electric signals of different frequencies based on a configuration of the switch.

6. The electronic vehicular key device of claim 1, further comprising a processor,
   wherein, in the second state, the processor is configured to control the switch to:

connect the antenna element to the ground to operate the antenna element and the physical key as a planar inverted F antenna (PIFA), and disconnect the antenna element from the around to operate the antenna element and the physical key as a dipole antenna.

7. The electronic vehicular key device of claim 1, wherein the wireless communication circuit is electrically connected to the first point through a matching circuit.

* * * * *